(12) United States Patent
Matsumi et al.

(10) Patent No.: US 9,099,406 B2
(45) Date of Patent: Aug. 4, 2015

(54) ORGANIC ELECTROLUMINESCENCE DISPLAY DEVICE, AND ELECTRONIC SYSTEM

(75) Inventors: Tatsuya Matsumi, Kanagawa (JP); Toshiaki Imai, Kanagawa (JP)

(73) Assignee: JOLED INC. (JP)

(*) Notice: Subject to any disclaimer, the term of this patent is extended or adjusted under 35 U.S.C. 154(b) by 231 days.

(21) Appl. No.: 13/571,109

(22) Filed: Aug. 9, 2012

(65) Prior Publication Data
US 2013/0049032 A1    Feb. 28, 2013

(30) Foreign Application Priority Data
Aug. 24, 2011    (JP) ................... 2011-182753

(51) Int. Cl.
H01L 51/52    (2006.01)
H01L 27/32    (2006.01)
H01L 51/00    (2006.01)

(52) U.S. Cl.
CPC ........ H01L 27/3211 (2013.01); H01L 27/3246 (2013.01); H01L 51/0004 (2013.01)

(58) Field of Classification Search
CPC ..... H01L 27/32; H01L 51/56; H01L 27/3211; H01L 27/3216; H01L 27/3244; H01L 33/60; H01L 29/86; H01L 27/28; H01L 21/28; H01L 51/504

USPC ............................... 257/40, 59, 72
See application file for complete search history.

(56) References Cited

U.S. PATENT DOCUMENTS

| | | | |
|---|---|---|---|
| 2006/0220532 A1* | 10/2006 | Tanabe et al. | 313/503 |
| 2007/0071885 A1* | 3/2007 | Kumagai | 427/66 |
| 2009/0009069 A1* | 1/2009 | Takata | 313/504 |
| 2011/0062859 A1* | 3/2011 | Kawamura | 313/504 |

FOREIGN PATENT DOCUMENTS

| | | |
|---|---|---|
| JP | 2004-327067 | 11/2004 |
| JP | 2010-158799 | 7/2010 |

* cited by examiner

*Primary Examiner* — Selim Ahmed
(74) *Attorney, Agent, or Firm* — Sheridan Ross P.C.

(57) ABSTRACT

An organic electroluminescence display device includes: a light emission region including a plurality of pixels on a drive substrate, wherein each of the pixels includes, in order from a side close to the drive substrate, a first electrode, a functional layer, and a second electrode, the first electrode is provided for each of the pixels, and the functional layer includes at least an organic electroluminescence layer; a print pattern layer included in the functional layer and formed individually for each of the pixels; and a protrusion provided on the drive substrate and protruding further than any layer provided between the print pattern layer and the drive substrate.

19 Claims, 29 Drawing Sheets

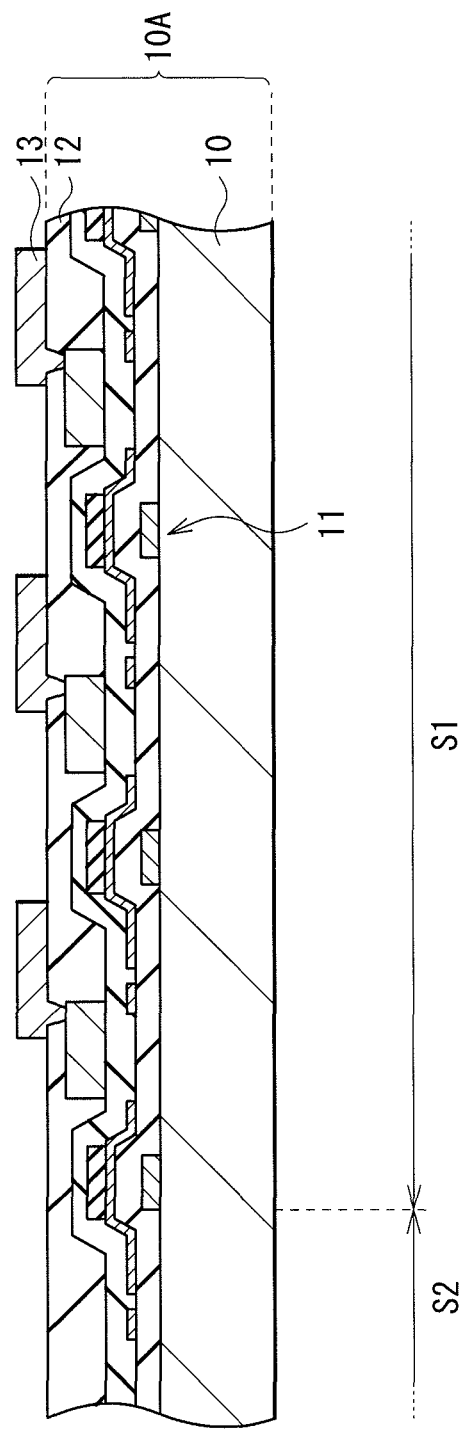

FIG. 9A
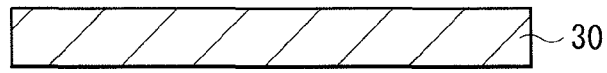
FIG. 9B
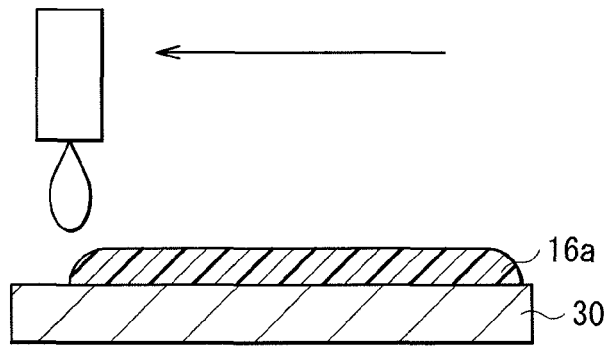
FIG. 9C
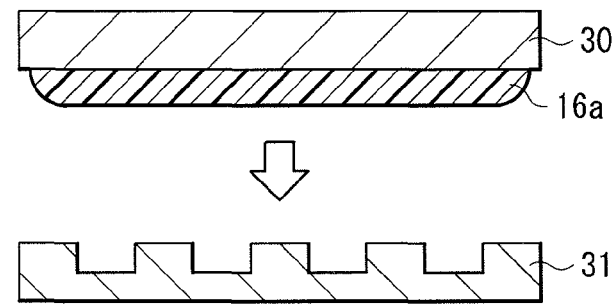
FIG. 9D
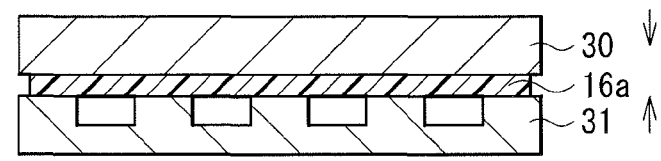
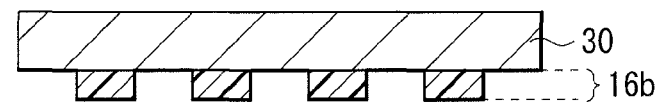
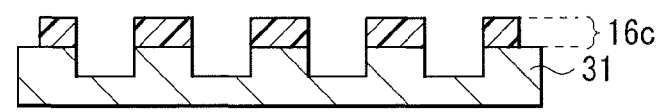
FIG. 10

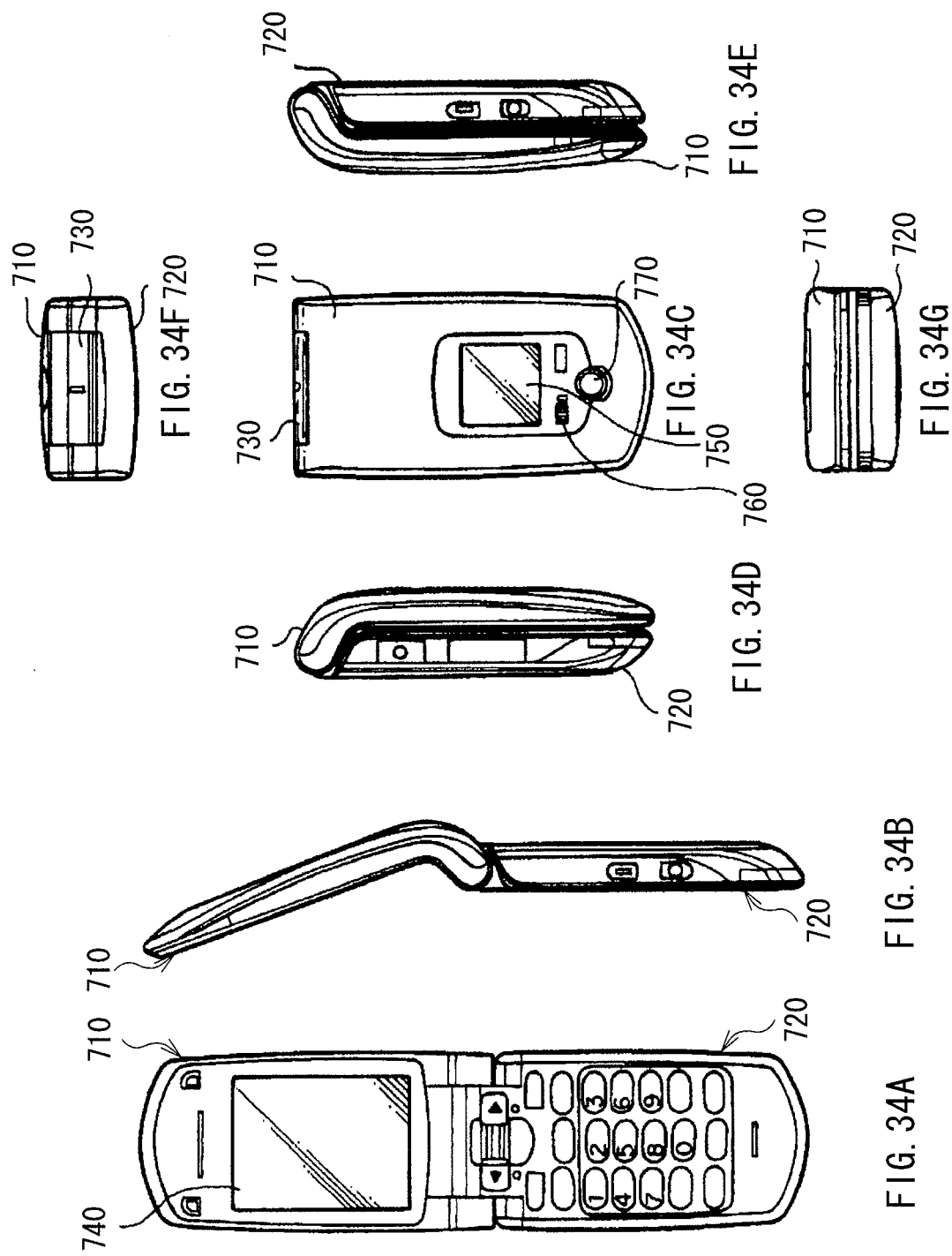

ORGANIC ELECTROLUMINESCENCE DISPLAY DEVICE, AND ELECTRONIC SYSTEM

CROSS REFERENCES TO RELATED APPLICATIONS

The present application claims priority to Japanese Priority Patent Application JP 2011-182753 filed in the Japan Patent Office on Aug. 24, 2011, the entire content of which is hereby incorporated by reference.

BACKGROUND

The disclosure relates to an organic electroluminescence (EL) display device that displays an image by utilizing an organic EL phenomenon, a method of manufacturing the organic EL display device, and an electronic system.

With acceleration of development in information and communication industry, high-performance display elements have been in demand. Among the display elements is an organic EL element that has been attracting attention as a next-generation display element. The organic EL element has an advantage of not only having a wide viewing angle as well as excellent contrast, but also having quick response time, to serve as a self-luminous-type display element.

Materials used for an organic layer of the organic EL element, such as a luminous layer, are classified roughly into low-molecular-weight materials and polymer materials. In fabrication of an organic EL display device that includes this organic EL element as a pixel, a dry process such as vacuum deposition is used as a technique of forming the organic layer, in a case where a low-molecular-weight material is used. On the other hand, in a case where a polymer material is used, there is employed a discharge printing method such as spin coating, ink-jet printing, and nozzle-jet printing, or a plate printing method such as flexographic printing, screen printing, gravure printing, and offset printing (reverse printing).

In the offset printing among the examples of the plate printing method, printing is performed by temporarily transferring the pattern of a plate to an intermediate transfer member called a blanket, and then causing this blanket to contact a printed substrate. As such offset printing, there have been suggested a method using a roll blanket (see Japanese Unexamined Patent Application Publication No. 2004-327067, for example), and a method using a flat blanket (see Japanese Unexamined Patent Application Publication No. 2010-158799, for example).

SUMMARY

However, in particular, when the flat blanket and the printed substrate are caused to contact each other, it is difficult to accurately transfer a print pattern formed on the blanket to a desired region on the printed substrate, because of bending, irregularities, and the like of the blanket. Therefore, for instance, in a process of manufacturing an organic EL display device in which individual formation of luminous layers having respective colors of R (red), G (green), and B (blue) is necessary, undesirable situations result when such luminous layers are transferred using the flat blanket. Specifically, misalignment of a pattern of the luminous layer takes place, which readily causes color unevenness, color mixture, and the like. As a result, the quality of a displayed image degrades.

It is desirable to provide an organic electroluminescence display device capable of suppressing image quality degradation resulting from distortion in a film formation process, a method of manufacturing such organic electroluminescence display device, and an electronic system provided with such organic electroluminescence display device.

An organic electroluminescence display device according to an embodiment of the application includes: a light emission region including a plurality of pixels on a drive substrate, each of the pixels including, in order from a side close to the drive substrate, a first electrode, a functional layer, and a second electrode, the first electrode being provided for each of the pixels, and the functional layer including at least an organic electroluminescence layer; a print pattern layer included in the functional layer and being formed individually for each of the pixels; and a protrusion provided on the drive substrate and protruding further than any layer provided between the print pattern layer and the drive substrate.

A method of manufacturing an organic electroluminescence display device according to an embodiment of the application includes: forming a plurality of first electrodes, a functional layer including at least an organic electroluminescence layer, and a second electrode in this order in a light emission region on a drive substrate to thereby form a plurality of pixels, a print pattern layer formed individually for each of the pixels being formed as a part of the functional layer; and forming a protrusion on the drive substrate, the protrusion being formed to protrude further than any layer formed on the drive substrate before the formation of the print pattern layer.

An electronic system according to an embodiment of the application is provided with an organic electroluminescence display device. The organic electroluminescence display device includes: a light emission region including a plurality of pixels on a drive substrate, each of the pixels including, in order from a side close to the drive substrate, a first electrode, a functional layer, and a second electrode, the first electrode being provided for each of the pixels, and the functional layer including at least an organic electroluminescence layer; a print pattern layer included in the functional layer and being formed individually for each of the pixels; and a protrusion provided on the drive substrate and protruding further than any layer provided between the print pattern layer and the drive substrate.

In the organic electroluminescence display device, the method of manufacturing the organic electroluminescence display device, and the electronic system according to the above-described embodiments of the application, the predetermined protrusion is provided on the drive substrate. Thus, for example, when at least one layer (for example, the print pattern layer) of the functional layer including the organic electroluminescence layer is formed individually for each of the pixels, occurrence of distortion in the light emission region is suppressed.

According to the organic electroluminescence display device, the method of manufacturing the organic electroluminescence display device, and the electronic system in the above-described embodiments of the application, the predetermined protrusion is provided on the drive substrate. This makes it possible to, when the luminous layer included in the functional layer is formed individually for each of the pixels, suppress the occurrence of the distortion in the light emission region. Hence, degradation in the quality of a displayed image resulting from the distortion in a film formation process is suppressed.

It is to be understood that both the foregoing general description and the following detailed description are exemplary, and are intended to provide further explanation of the application as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the application.

FIG. 6 is a cross-sectional diagram used to explain a method of manufacturing the organic EL display device illustrated in FIG. 1.

FIGS. 9A to 9D are cross-sectional diagrams illustrating a process of forming (transferring) a print pattern layer onto a blanket.

FIG. 10 is a cross-sectional diagram illustrating a process following FIG. 9D.

FIG. 31A is an appearance when viewed from front, and FIG. 31B is an appearance when viewed from back.

FIGS. 34A to 34G are diagrams of application example 5, namely, a front view in an open state, a side view in the open state, a front view in a closed state, a left-side view, a right-side view, a top view, and a bottom view, respectively.

DETAILED DESCRIPTION

Embodiments of the application will be described below in detail with reference to the drawings. It is to be noted that the description will be provided in the following order.
1. First embodiment (an example in which an elongated projection section is provided in a peripheral region, and a luminous layer is provided to have a color for each pixel)
2. Modification 1 (a configuration example of the elongated projection section)
3. Second embodiment (an example in which a bank is provided)
4. Modification 2 (an example in which an elongated projection section is formed in the same process as that of a planarizing film of a drive substrate)
3. Application examples (examples of application to electronic units)

First Embodiment

Configuration of Organic EL Display Device

Figure 1:
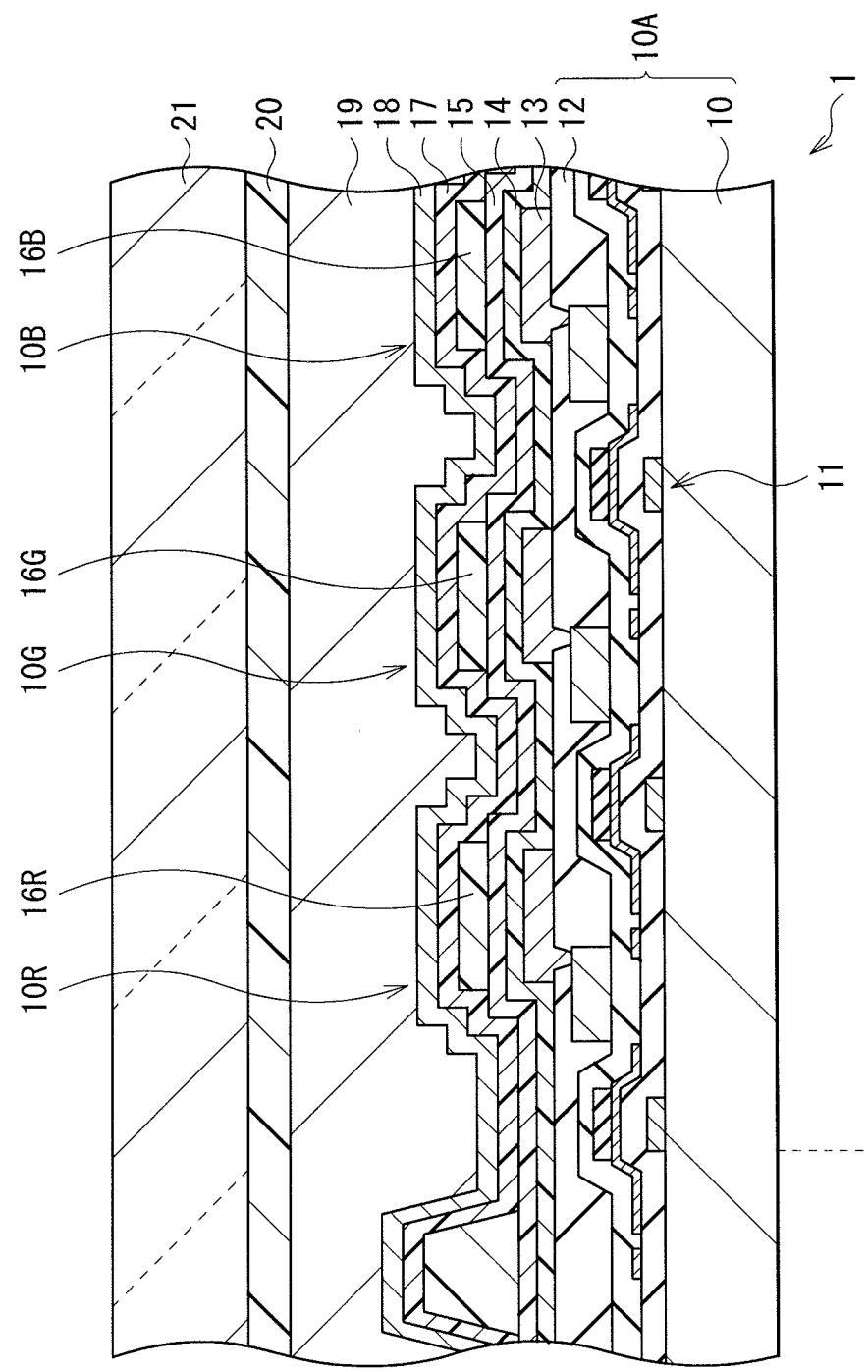
FIG. 1 is a diagram illustrating a cross-sectional configuration of an organic EL display device according to a first embodiment of the disclosure.

FIG. 1 illustrates a cross-sectional configuration of an organic EL display device (an organic EL display device 1) according to a first embodiment. The organic EL display device 1 is used, for example, as an organic EL television or the like capable of performing full color display. In this organic EL display device 1, for example, an organic EL element 10R emitting red light, an organic EL element 10G emitting green light, and an organic EL element 10B emitting blue light are arranged, for instance, in a matrix on a drive substrate 10A. The organic EL elements 10R, 10G, and 10B are included as a plurality of pixels (sub-pixels) structuring a light emission region (a display region) S1.

(Drive Substrate 10A)

In the drive substrate 10A, a drive circuit (a pixel driving circuit 140 which will be described later, for example) including a TFT 11 is disposed on a substrate 10. The substrate 10 is made of, for example, quartz, glass, metal foil, silicon, or plastic. In the TFT 11, an electrode wiring layer such as a gate as well as a source/drain, a semiconductor layer forming a channel, an interlayer insulating film, and the like are laminated, for example. This TFT 11 corresponds to, for instance, a drive transistor Tr1 and a write transistor Tr2 in the pixel driving circuit 140 to be described later. The TFT 11 may be in an inverted staggered structure (a so-called bottom gate type), or in a staggered structure (a top gate type), for example. A surface of this drive substrate 10A is planarized by a planarizing film 12.

The planarizing film 12 is, for example, an organic insulating film made of polyimide resin, acrylic resin, novolac resin, or the like. This planarizing film 12 has a contact hole used to connect the TFT 11 to a lower electrode (a first electrode 13 to be described later) of each pixel electrically. The first electrode 13 is provided for every pixel, to fill this contact hole. Electrical connection between the TFT 11 and the first electrode 13 allows a predetermined electric potential to be supplied to each of the organic EL elements 10R, 10G, and 10B. It is to be noted that the planarizing film 12 is not necessarily provided. When it is not necessary to planarize the drive substrate 10A, a material of the interlayer insulating film used in a layered structure of the TFT 11 may be used. Examples of this material include silicon oxide (SiOx), silicon nitride (SiNx), titanium oxide (TiOx), and titanium nitride (TiN). Alternatively, a mixed composition of these examples, a metal oxide with no conductivity, or the like may be used.

Figure 2:
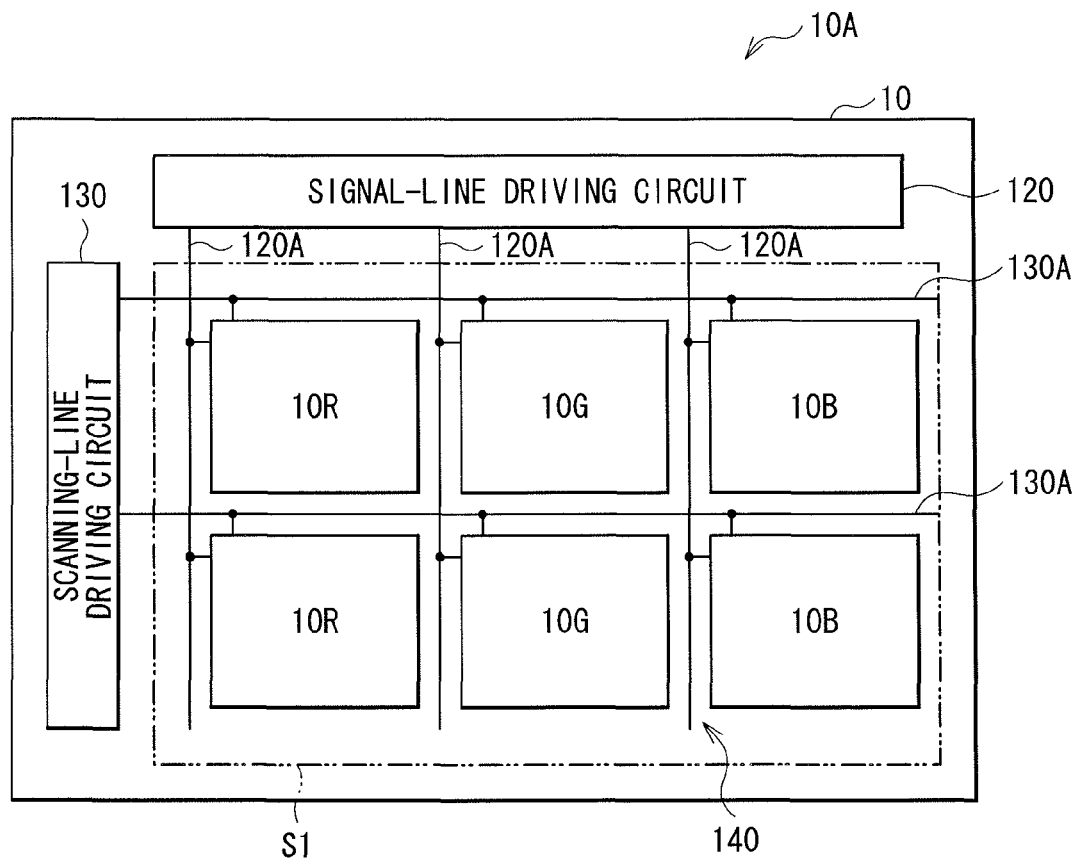
FIG. 2 is a schematic diagram illustrating an example of a pixel driving circuit of the organic EL display device depicted in FIG. 1.
Figure 3:
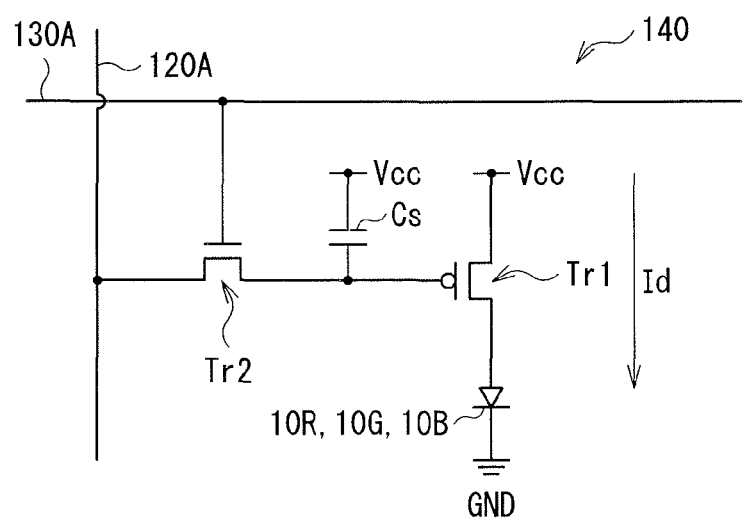
FIG. 3 is a circuit diagram illustrating an example of a pixel circuit depicted in FIG. 2.

FIG. 2 illustrates an example of the drive circuit of the drive substrate 10A. In the drive substrate 10A, the pixel driving circuit 140 is provided in the display region S1. Around the display region S1, a signal-line driving circuit 120 and a scanning-line driving circuit 130 serving as drivers for image display are provided. FIG. 3 illustrates an example of the pixel driving circuit 140. The pixel driving circuit 140 is an active-type driving circuit formed below the first electrode 13. The pixel driving circuit 140 includes the drive transistor Tr1 as well as the write transistor Tr2 (equivalent to the TFT 11 described above), and a capacitor (a retention capacitor) Cs provided between these transistors Tr1 and Tr2. The pixel driving circuit 140 further includes the organic EL element 10R (or the organic EL element 10G or 10B) connected to the drive transistor Tr1 in series, between a first power supply line (Vcc) and a second power supply line (GND).

In the pixel driving circuit 140, a plurality of signal lines 120A are arranged in a column direction, and a plurality of scanning lines 130A are arranged in a row direction. An intersection of each of the signal lines 120A with each of the scanning lines 130A corresponds to any of the organic EL elements 10R, 10G, and 10B. Each of the signal lines 120A is connected to the signal-line driving circuit 120. An image signal is supplied from this signal-line driving circuit 120 to a source electrode of the write transistor Tr2 through the signal line 120A. Each of the scanning lines 130A is connected to the scanning-line driving circuit 130. A scanning signal is sequentially supplied from this scanning-line driving circuit 130 to a gate electrode of the write transistor Tr2 through the scanning line 130A.

(Organic EL Elements 10R, 10G, and 10B)

In each of the organic EL elements 10R, 10G, and 10B, the first electrode 13, a hole injection layer 14, a hole transport layer 15, a luminous layer (a red luminous layer 16R, a green luminous layer 16G, a blue luminous layer 16B), an electron transport layer 17, and a second electrode 18 are laminated in this order on the drive substrate 10A. The first electrode 13 serves as, for example, an anode, and the second electrode 18 serves as, for example, a cathode. The organic EL elements 10R, 10G, and 10B are covered with a protective layer 19. Further, a sealing substrate 21 made of glass or the like is adhered onto the protective layer 19, by an adhesive layer 20 made of thermosetting resin, UV-curable resin, or the like. The entire display region is thereby sealed.

The first electrode 13 is provided for the pixel of each of the organic EL elements 10R, 10G, and 10B. The first electrode 13 has a thickness of, for example, about 10 nm or more and 1,000 nm or less both inclusive. In a case of a bottom emission type, the first electrode 13 is a transparent conductive film made of, for example, indium tin oxide (ITO), indium zinc oxide (InZnO), and an alloy of zinc oxide (ZnO) and aluminum (Al). This transparent conductive film may be a single layer film made of any one kind, or a laminated film made of two or more kinds of these examples. In a case of a top emission type, the first electrode 13 is configured using a conductive material with superior light reflectivity. This first electrode (the lower electrode) 13 is made of, for example, a simple substance or an alloy of metallic elements such as chromium (Cr), gold (Au), platinum (Pt), nickel (Ni), copper (Cu), tungsten (W), and silver (Ag). Alternatively, the first electrode 13 may have a layered structure that includes a metal film and a transparent conductive film. In this layered structure, the metal film may be made of a simple substance or an alloy of the metallic elements mentioned above, and the transparent conductive film may be made of ITO, InZnO, and an alloy of zinc oxide (ZnO) and aluminum (Al), or the like. It is to be noted that when the first electrode 13 functions as the anode, it is desirable that the first electrode 13 be configured using a material with a high hole-injection ability. However, a material without a high hole-injection ability (e.g., an aluminum alloy) may be used as the first electrode 13, by separately providing the hole injection layer 14 appropriate thereto.

For a wiring connection part of the first electrode 13 and the TFT 11, a material such as a metal or a metal oxide which is a highly conductive material is used, and a connection surface between the wiring connection part and the first electrode (the lower electrode) 13 includes a material which is low in contact resistance. Examples of a material used in the wiring connection part include molybdenum (Mo), titanium (Ti), and the like. Alternatively, aluminum (Al), copper (Cu), or the like employing any of these molybdenum, titanium, and the like as a barrier metal may be used.

The hole injection layer 14 is provided to increase efficiency of hole injection into the red luminous layer 16R, the green luminous layer 16G, and the blue luminous layer 16B, and also serves as a buffer layer that prevents leakage. The hole injection layer 14 is made of, for example, a polymer material, and formed such as by a printing method and/or a coating method. It is only necessary for the polymer material to have a weight-average molecular weight (Mw) in a range of about 10,000 to about 300,000 both inclusive. In particular, a weight-average molecular weight (Mw) of about 5000 to about 200,000 both inclusive is preferable. An oligomer with a weight-average molecular weight (Mw) of about 2000 to about 10,000 both inclusive may be used. However, when the weight-average molecular weight (Mw) is less than 5000, there is a possibility that the hole injection layer will dissolve during formation of layers subsequent to the hole transport layer. In addition, when the weight-average molecular weight (Mw) exceeds 300,000, it is difficult to form a film because the material gels. It is to be noted that the weight-average molecular weight (Mw) corresponds to a value obtained when a weight-average molecular weight in polystyrene equivalent is determined by gel permeation chromatography (GPC), through use of tetrahydrofuran as a solvent. The material of the hole injection layer 14 may be selected as appropriate, considering relations with the electrode and materials of adjacent layers. Examples of the material of the hole injection layer 14 include polyaniline, oligoaniline, polythiophene, polypyrrole, polyphenylene vinylene, polythienylene vinylene, polyquinoline, polyquinoxaline, derivatives of these materials, electroconductive polymers such as a polymer including an aromatic amine structure in a main chain or a side chain, metallophthalocyanine (copper phthalocyanine and the like), and carbon. The hole injection layer 14 has, for example, a thickness of about 5 nm to about 100 nm both inclusive.

The hole transport layer 15 is provided to increase efficiency of hole transport to the red luminous layer 16R, the green luminous layer 16G, and the blue luminous layer 16B. As with the hole injection layer 14, the hole transport layer 15 is made of, for example, a polymer material, and formed by a printing method or the like. The weight-average molecular weight (Mw) of the hole transport layer 15 is preferably about 50,000 to about 300,000 both inclusive, and in particular, preferably about 100,000 to about 200,000 both inclusive. When the weight-average molecular weight (Mw) is less than 50,000, a low-molecular component in the polymer material falls off during formation of the luminous layer (16R, 16G, and 16B). This possibly decreases initial performance of the organic EL element, or causes deterioration of the element. On the other hand, when the weight-average molecular weight (Mw) exceeds 300,000, it is difficult for form a film because the material gels. As the polymer material of the hole transport layer 15, a luminescent material soluble in an organic solvent which will be described later may be used. Examples of this luminescent material include polyvinylcarbazole, polyfluorene, polyaniline, polysilane, derivatives of these materials, polysiloxane derivatives each having aromatic amine in a main chain or a side chain, polythiophene as well as derivatives thereof, and polypyrrole. The thickness of this hole transport layer 15 is, for example, about 10 nm to about 200 nm both inclusive, depending on the overall configuration of the element.

In the red luminous layer 16R, the green luminous layer 16G, and the blue luminous layer 16B, electron-hole recombination takes place and color light is emitted, when an electric field is applied. Any of the red luminous layer 16R, the green luminous layer 16G, and the blue luminous layer 16B includes a polymer (light emission) material, and may be formed such as by a printing method, for example. As the polymer material, the following examples may be used for each color of light emission. For each of the red luminous layer 16R and the green luminous layer 16G, a polyfluorene-based polymer derivative, a (poly)para-phenylene vinylene derivative, a polyphenylene derivative, a polyvinylcarbazole derivative, a polythiophene derivative, a perylene-based pigment, a coumarin-based pigment, a rhodamine-based pigment, or one with a polymer doped with an organic EL material, for example, may be used as the polymer material. As a doped material, rubrene, perylene, 9,10-diphenylanthracene, tetraphenylbutadiene, nile red, coumarin 6, or the like may be used. For the blue luminous layer 16B, an anthracene derivative may be used as a host material, and a low-molecular-weight fluorescent material, a mineral phosphate pigment, a metal complex, or the like may be used as a doped material. The red luminous layer 16R, the green luminous layer 16G, and the blue luminous layer 16B each have a thickness of, for example, about 10 nm to about 200 nm both inclusive, depending on the overall configuration of the element.

At the time when each of the hole injection layer 14, the hole transport layer 15 as well as the red luminous layer 16R, the green luminous layer 16G, and the blue luminous layer 16B are formed, a solution in which any of the polymer materials described above is dissolved in an organic solvent is used. The organic solvent contains, for instance, one or more kinds of toluene, xylene, anisole, cyclohexanone, mesitylene (1,3,5-trimethylbenzene), pseudocumene(1,2,4-trimethylbenzene), dihydrobenzofuran, 1,2,3,4-tetramethylbenzene, tetralin, cyclohexylbenzene, 1-methylnaphthalene, p-anisyl alcohol, dimethylnaphthalene, 3-methylbiphenyl, 4-methylbiphenyl, 3-isopropylbiphenyl, monoisopropylnaphthalene, and the like.

The electron transport layer 17 is provided to increase efficiency of electron transport to the luminous layers 16R, 16G, and 16B. As a material of the electron transport layer 17, there may be used quinoline, perylene, phenanthroline, bisstyryl, pyrazine, triazole, oxazole, fullerene, oxadiazole, fluorenone, or any of derivatives and metal complexes of these materials, for example. Specifically, there may be used tris(8-hydroxyquinoline)aluminum (abbreviated as $Alq_3$), anthracene, naphthalene, phenanthrene, pyrene, perylene, butadiene, coumarin, $C_{60}$, acridine, stilbene, 1,10-phenanthroline, or any of derivatives and metal complexes of these materials, for example.

Here, the hole injection layer 14, the hole transport layer 15, the luminous layer (the red luminous layer 16R, the green luminous layer 16G, and the blue luminous layer 16B), and the electron transport layer 17 are provided as a specific but not limitative example of "functional layer" in one embodiment of the application. In addition, the red luminous layer 16R, the green luminous layer 16G, and the blue luminous layer 16B are formed individually for the corresponding pixels, and are each equivalent to a specific but not limitative example of "print pattern layer" in one embodiment of the application. Other layers of the functional layer except the luminous layer, such as the hole injection layer 14, the hole transport layer 15, and the electron transport layer 17, are provided as layers common to each pixel. In the present embodiment, the red luminous layer 16R, the green luminous layer 16G, and the blue luminous layer 16B of the functional layer are a printed film formed through offset printing that uses a blanket to be described later.

It is to be noted that, for example, the luminous layer of each color may be provided as being common to each pixel (for instance, there may be provided a tandem structure in which luminous layers for the respective three colors of RGB are laminated), without being limited to the above-described configuration. Alternatively, only one or some of the luminous layers may be provided as being common to each pixel (for example, the red luminous layer and the green luminous layer may be formed individually for an R pixel and a G pixel, respectively, and the blue luminous layer may be provided as a layer common to all pixels). Further, of the functional layer, the layer formed individually for each pixel is not limited to the luminous layer. Alternatively, one or more layers among the hole injection layer 14, the hole transport layer 15, and the electron transport layer 17 may be formed for each pixel.

The second electrode 18 has, for example, a thickness of about 2 nm or more and 200 nm or less both inclusive, and is configured using a conductive film. Specifically, in the case of the bottom emission type, a simple metal of or an alloy containing one or more kinds of aluminum (Al), magnesium (Mg), calcium (Ca), and sodium (Na) may be used. Alternatively, in the case of the top emission type, a transparent conductive film made of ITO or the like may be used. The second electrode 18 may be formed on the functional layer (the electron transport layer 17), in a state of being insulated from the first electrode 13. The second electrode 18 is an electrode common to the organic EL elements 10R, 10G, and 10B.

It is to be noted that, between the electron transport layer 17 and the second electrode 18, an electron injection layer not illustrated may be provided. As an electron injection material, a lithium oxide ($Li_2O$) which is an oxide of lithium (Li), a cesium carbonate ($Cs_2CO_3$) which is a complex oxide of cesium (Cs), or a mixture of these oxide and complex oxide may be used, for instance. Alternatively, there may be used metals with small work functions such as alkaline earth metals including calcium (Ca) and barium (Ba), alkali metals including lithium and cesium, and other metals including indium (In) and magnesium, for example.

The protective layer 19 has, for example, a thickness of about 2 μm to about 3 μm both inclusive, and may be configured using either an insulating material or a conductive material. As the insulating material, it is preferable to use an inorganic amorphous material. Examples of the inorganic amorphous material include amorphous silicon (α-Si), amorphous silicon carbide (α-SiC), amorphous silicon nitride (α-$Si_1$-xNx), and amorphous carbon (α-C). Such an inorganic amorphous material does not form grains and thus has low permeability, thereby forming a satisfactory protective film.

The sealing substrate 21 seals the organic EL elements 10R, 10G, and 10B, in cooperation with the adhesive layer 20. The sealing substrate 21 is configured using a material such as glass which is transparent to the color light generated in each of the organic EL elements 10R, 10G, and 10B. For example, a color filter and a black matrix (a light-shielding film) may be provided for the sealing substrate 21 (neither is illustrated). This allows extraction of the color light generated in each of the organic EL elements 10R, 10G, and 10B, and absorption of external light reflected from wiring etc. and between the organic EL elements 10R, 10G, and 10B, thereby improving contrast. The color filter includes red, green, and blue filters disposed to correspond to the organic EL elements 10R, 10G, and 10B, and the filter of each color is made of a resin mixed with a pigment. The light-shielding film is configured using, for example, a resin film mixed with a black coloring agent, or a thin-film filter using thin-film interference. The thin-film filter is, for example, configured by laminating one or more thin films each made of a metal, a metal nitride, or a metal oxide, and attenuates the light by using the thin-film interference.

(Elongated Projection Section 22)

In a peripheral region (a frame region) S2 of the light emission region S1 including the organic EL elements 10R, 10G, and 10B, an elongated projection section 22 (a protrusion) is provided. In a process of forming the functional layer by using offset printing, the elongated projection section 22 functions as a starting point of bringing the drive substrate and the blanket into contact with each other, as will be described later in detail. This elongated projection section 22 protrudes further than a layer provided between the layer formed individually for each pixel (for example, the print pattern layer) in the functional layer and the drive substrate 10A. In other words, the elongated projection section 22 protrudes further than a base layer (including, for example, the first electrode 13, the hole injection layer 14, and the hole transport layer 15) of the print pattern layer, which is formed prior to the print pattern layer. The elongated projection section 22 is made of, for example, an insulating material, specifically, polyimide resin, acrylic resin, or novolac resin.

As used herein, the wording "the layer "between" the print pattern layer and the drive substrate 10A" refers to a part of the base layer, laminated between the print pattern layer and the drive substrate 10A (e.g., the first electrode 13, the hole injection layer 14, and the hole transport layer 15), that faces the print pattern layer. For example, the elongated projection section 22 may be formed to be higher than a part, of the base layer, that corresponds to the display region. However, this may not apply to a region where the print pattern layer is not formed, of the base layer. In other words, for example, in a part of the base layer, the part corresponding to the peripheral region, the base layer may be formed to be higher than the elongated projection section. For instance, depending on timing of forming the elongated projection section 22, a part of the base layer (for example, the hole injection layer, the hole transport layer, and the like: see modifications 1 and 2 which will be described later) may be formed to be higher in layer than the elongated projection section (formed to cover the elongated projection section) in the peripheral region (in the display region, the elongated projection section is provided to protrude further than the base layer). Thus, it is good enough for the elongated projection section 22 to protrude further than at least the part corresponding to the display region, in which part the print pattern layer is formed, among the layers provided between the print pattern layer and the drive substrate 10A.

Figure 4:
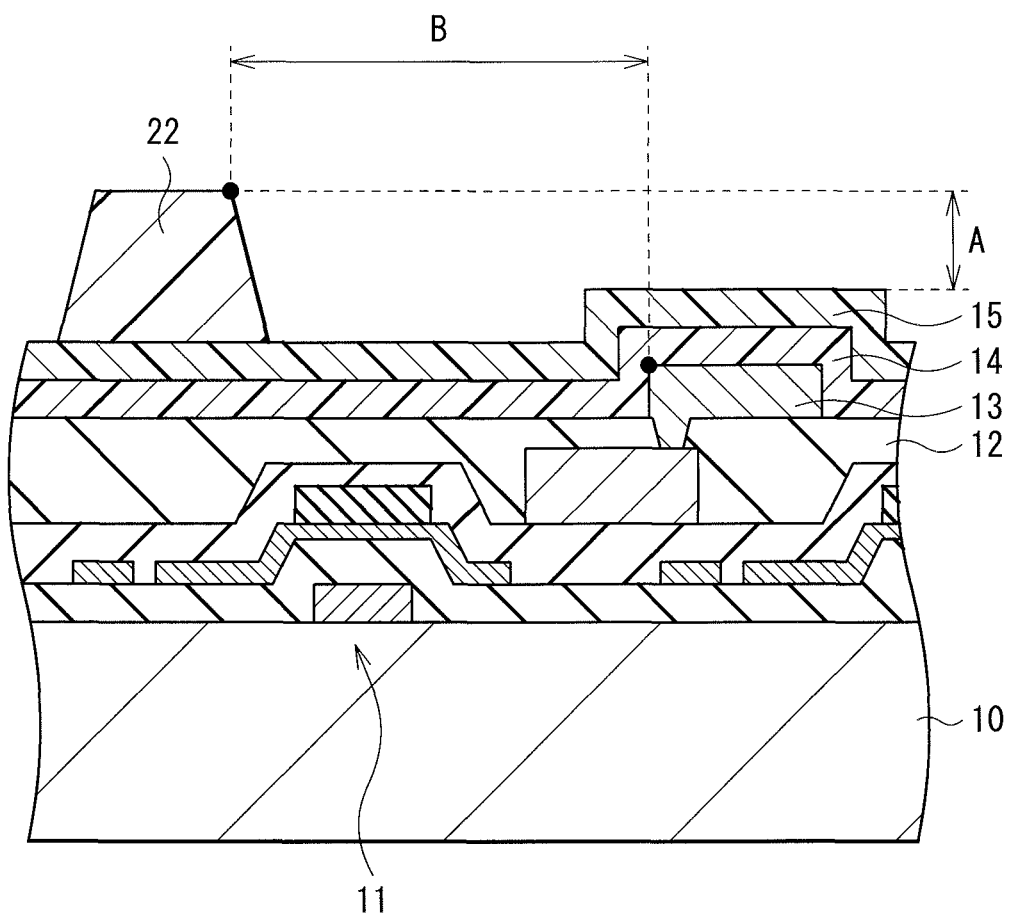
FIG. 4 is an enlarged view of a vicinity of an elongated projection section illustrated in FIG. 1.

FIG. 4 is an enlarged view of a vicinity of the elongated projection section 22. In the present embodiment, the print pattern layer formed by the offset printing using the blanket corresponds to each of the red luminous layer 16R, the green luminous layer 16G, and the blue luminous layer 16B. The elongated projection section 22 is formed to protrude further than any of the first electrode 13, the hole injection layer 14, and the hole transport layer 15 that are provided between these luminous layers and the drive substrate 10A. Here, assuming that a difference in height between a top surface of the elongated projection section 22 (i.e. the uppermost surface in the peripheral region S2) and a top surface of the hole transport layer 15 (i.e. the uppermost surface in the light emission region S1 at the time before the luminous layers are formed) is A (nm), it is preferable to satisfy the following expression (1). It has been experimentally found that satisfying the expression (1) avoids initial contact in the light emission region S1, and suppresses occurrence of distortion in the light emission region S1, in a printing process by the offset printing which will be described later.

$$A \geq 500 \tag{1}$$

In addition, in a region between the elongated projection section 22 and the light emission region S1 (i.e. a region in proximity to the elongated projection section 22), the contact between the blanket and the drive substrate 10A weakens, and therefore, it is preferable to keep a certain distance. Specifically, it is preferable to satisfy the following expression (2), where a distance between a top-surface end part of the elongated projection section 22 and a top-surface end part of the first electrode 13 is B.

$$B \geq A \tag{2}$$

Figure 5A:
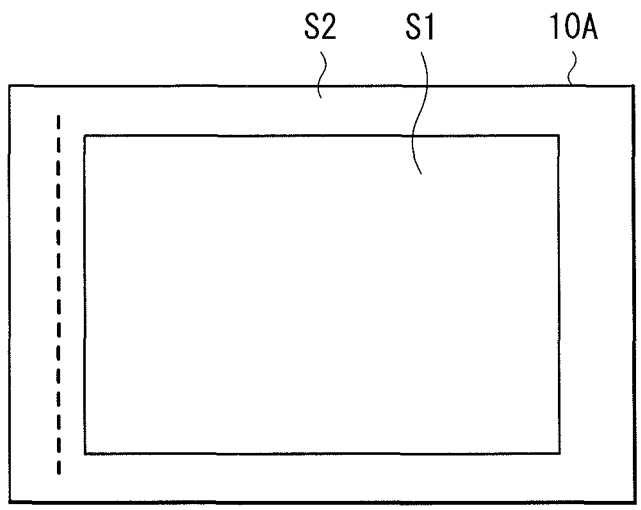
FIGS. 5A to 5C are schematic diagrams each illustrating an arrangement example of the elongated projection section depicted in FIG. 1.
Figure 5B:
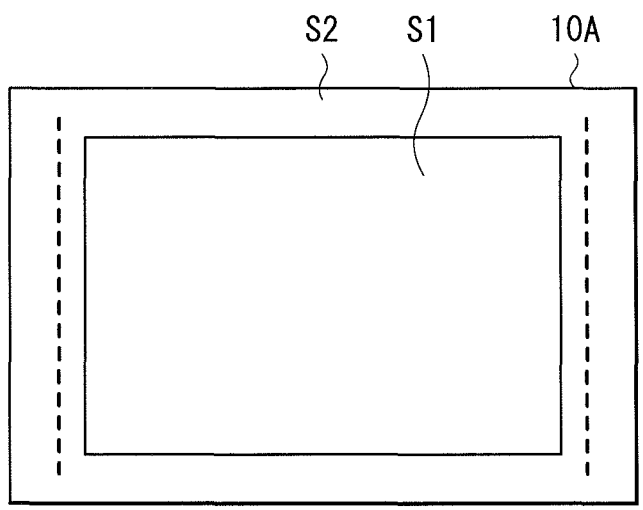
Figure 5C:
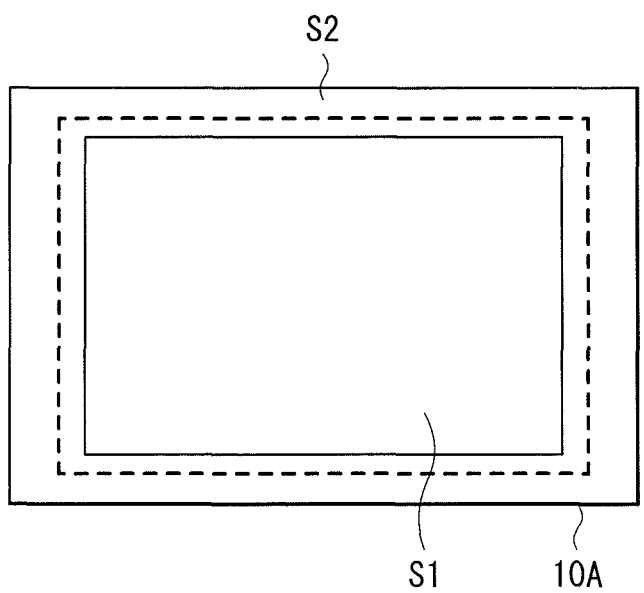

FIGS. 5A to 5C are diagrams of the drive substrate 10A viewed from right above. FIG. 5A to 5C each schematically illustrate a location where the elongated projection section 22 is disposed on the substrate. For example, it is preferable that the elongated projection section 22 be provided in a part of the peripheral region S2 of the drive substrate 10A. Specifically, when a surface of the drive substrate 10A is in a rectangular shape, the elongated projection section 22 may be provided along one short side of the rectangular shape of the peripheral region S2 as illustrated in FIG. 5A, or along each of two short sides of the rectangular shape of the peripheral region S2 as illustrated in FIG. 5B. Alternatively, as illustrated in FIG. 5C, the elongated projection section 22 may be provided at all of four sides (to surround the light emission region S1) of the rectangular shape. In this way, the region where the elongated projection section 22 is disposed may be at any location in the peripheral region S2. However, when the elongated projection section 22 is provided only at one side of the drive substrate 10A, it may be difficult to control the distortion in, for example, an application to a large-sized display in particular. Thus, it is more preferable to provide the elongated projection section 22 in regions at two or more sides of the rectangular shape, as in examples in FIGS. 5B and 5C.

[Method of Manufacturing Organic EL Display Device]

The organic EL display device 1 may be produced as follows, for example. FIG. 6 to FIG. 14 illustrate a method of manufacturing the organic EL display device 1 in a process order.

First, the drive substrate 10A having the TFT 11 covered by the planarizing film 12 as described above is prepared. In this drive substrate 10A, contact holes are formed in predetermined regions of the planarizing film 12, by using a photolithography technique and an etching (wet etching or dry etching) technique. Subsequently, the first electrode 13 is formed to fill each of the contact holes, as illustrated in FIG. 6. Specifically, a layer of the material described above of the first electrode 13 is formed over the entire surface of the drive substrate 10A, and then patterned into a predetermined shape (e.g., to be rectangular) by etching using a photolithography method.

Figure 7:
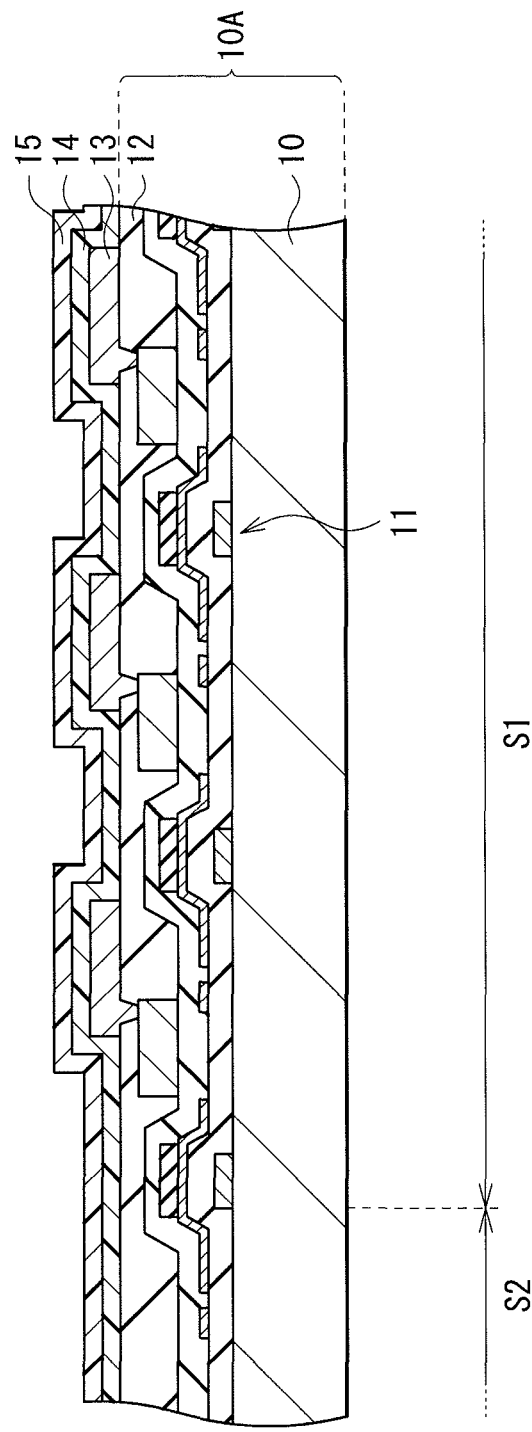
FIG. 7 is a cross-sectional diagram illustrating a process following FIG. 6.

Next, some (the hole injection layer 14 and the hole transport layer 15) of the functional layer are formed on the first electrodes 13, as illustrated in FIG. 7. Specifically, first, the hole injection layer 14 made of the material described above is applied to the entire surface of the drive substrate 10A, and then dried with heat by undergoing a vacuum drying process. Subsequently, the hole transport layer 15 made of the material described above is applied and then dried by going through a similar application process and a similar vacuum drying process. It is to be noted that as an application method of each of the hole injection layer 14 and the hole transport layer 15, various kinds of coating method including ink-jet printing, slit coating, spin coating, and spray coating may be used. Above all, the slit coating allows relatively easy film formation. When the ink-jet printing is employed, it is preferable that a partition (a bank to be described later) be formed, which allows a film having a stable film thickness to be formed on the first electrode 13.

(Protrusion Formation Process)

Figure 8:
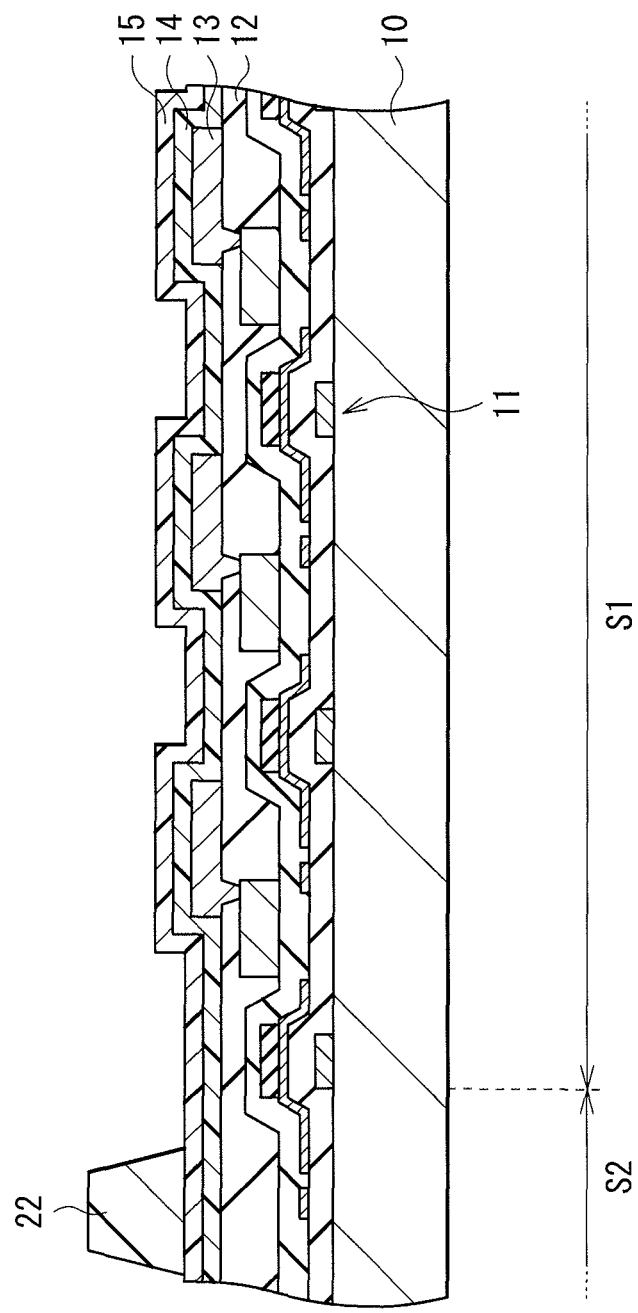
FIG. 8 is a cross-sectional diagram illustrating a process following FIG. 7.

Next, the elongated projection section 22 is formed in a part of the peripheral region S2 on the drive substrate 10A, as illustrated in FIG. 8. Specifically, a layer of the insulating material described above of the elongated projection section 22 is formed over the entire surface of the hole transport layer 15, and then patterned by a photolithography method. At this moment, the elongated projection section 22 is so formed as to project further than any of the layers formed on the drive substrate 10A, as described above. Preferably, the film thickness, width, position, and the like of the elongated projection section 22 are so set as to satisfy the expressions (1) and (2). This process of forming the elongated projection section 22 may be carried out before the film formation process of the print pattern layer (in this embodiment, the luminous layer) by the offset printing to be described later.

(Offset Printing Process)

After the elongated projection section 22 is formed in the manner described above, each of the red luminous layer 16, the green luminous layer 16G, and the blue luminous layer 16B is formed by the offset printing. As used herein, the offset printing may refer to a technique of performing printing in which a print pattern is temporarily transferred from a plate onto the blanket, and a layer having this print pattern transferred to the blanket is then pressed against a printed substrate (the drive substrate 10A), or may refer to other technique similar thereto. In the present embodiment, the luminous layer (the red luminous layer 16R, the green luminous layer 16G, and the blue luminous layer 16B), in which the individual formation is to be performed for each pixel, is formed using such offset printing. Specifically, the printing may be performed for the luminous layer of each color, in the following procedure.

First, the print pattern is transferred onto the blanket (a blanket 30), by using the plate (a plate 31). Specifically, the blanket 30 is prepared as illustrated in FIG. 9A. For example, a flat or sheet-like blanket having a size and a shape equal to those of the drive substrate 10A is used as the blanket 30. A surface (on the side where the print pattern layer is to be formed) of the blanket 30 is coated with silicone rubber, butadiene rubber, or fluorocarbon resin, for example. Alternatively, the blanket 30 itself may be made of such a material. Of these, in particular, the silicone rubber is a material expected to exhibit satisfactory transferability as it is superior in mold releasability. It is to be noted that this blanket 30 may be kept in a planar state, by being supported with a rigid substrate made of metal, glass, or the like, or with a so-called adsorption chuck.

Next, as illustrated in FIG. 9B, ink containing the material of the luminous layer is applied to the surface of the blanket 30 by slit coating, for example, to thereby form an organic film 16a on the blanket 30. The organic film 16a formed on the blanket 30 is then arranged to face the plate 31, as illustrated in FIG. 9C. The plate 31 has projections and depressions corresponding to the print pattern, for example. The plate 31 is then clamped to the organic film 16a as illustrated in FIG. 9D.

The blanket 30 is then detached from the plate 31, and thereby a part (16c) of the organic film 16a is removed by the plate 31. This part (16c) corresponds to a selective region (e.g., projections) of the plate 31. As a result, a reverse pattern remains on the blanket 30, as illustrated in FIG. 10. In this way, a print pattern layer 16b is formed on the blanket 30. This print pattern layer 16b formed on the blanket 30 is then transferred onto the drive substrate 10A.

In the present embodiment, each of the red luminous layer 16R, the green luminous layer 16, and the blue luminous layer 16B is sequentially formed as the print pattern layer 16b, on the corresponding pixel. Here, a process of printing the red luminous layer 16R will be described as a representative example.

Figure 11:
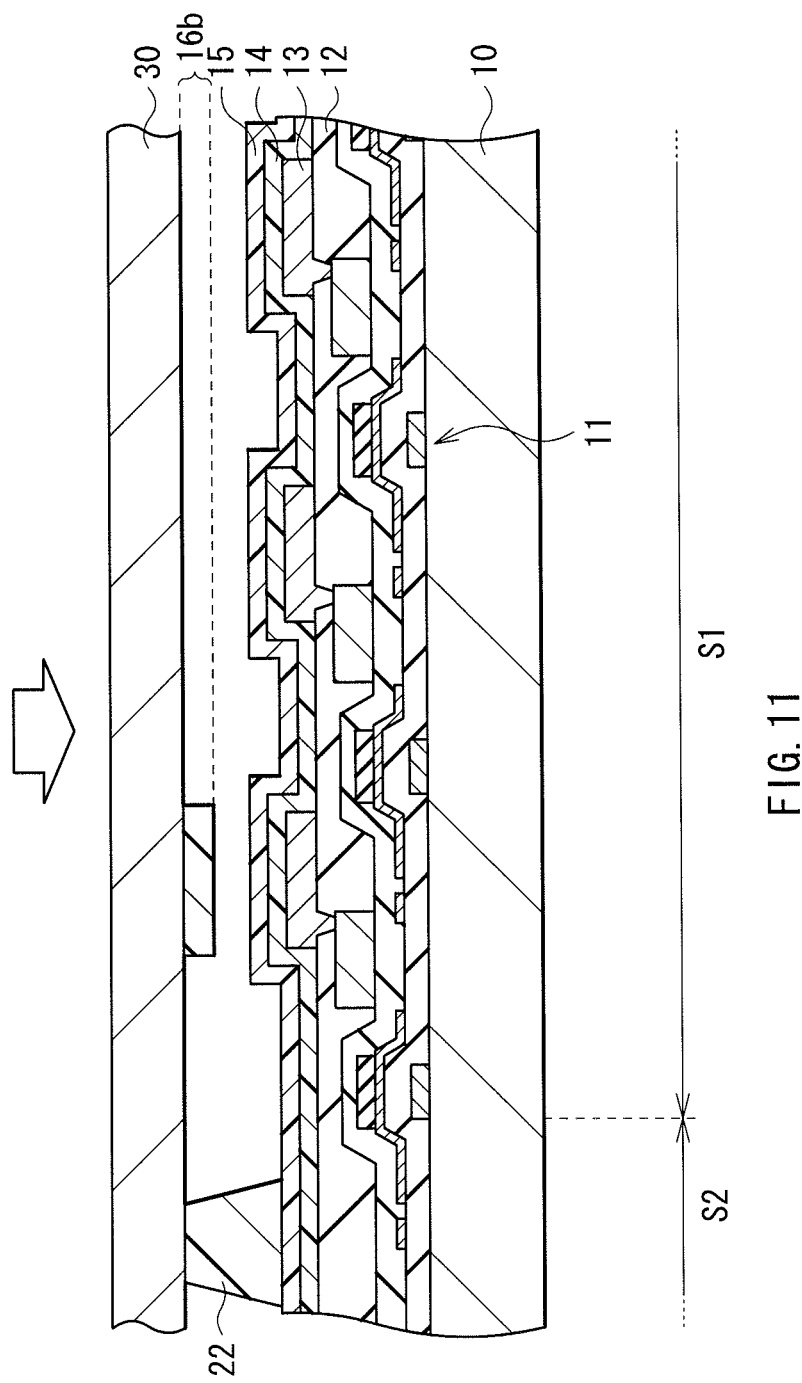
FIG. 11 is a cross-sectional diagram illustrating a process following FIG. 8.

First, as illustrated in FIG. 11, the blanket 30 having the red luminous layer 16R that has been patterned (corresponding to the print pattern layer 16b) is laid on the drive substrate 10A. On the blanket 30, the red luminous layer 16R is formed in a selective region corresponding to the R pixel (the organic EL element 10R) on the drive substrate 10A. When laying the blanket 30, alignment may be carried out by reading alignment marks provided on both of the blanket 30 and the drive substrate 10A.

Figure 12:
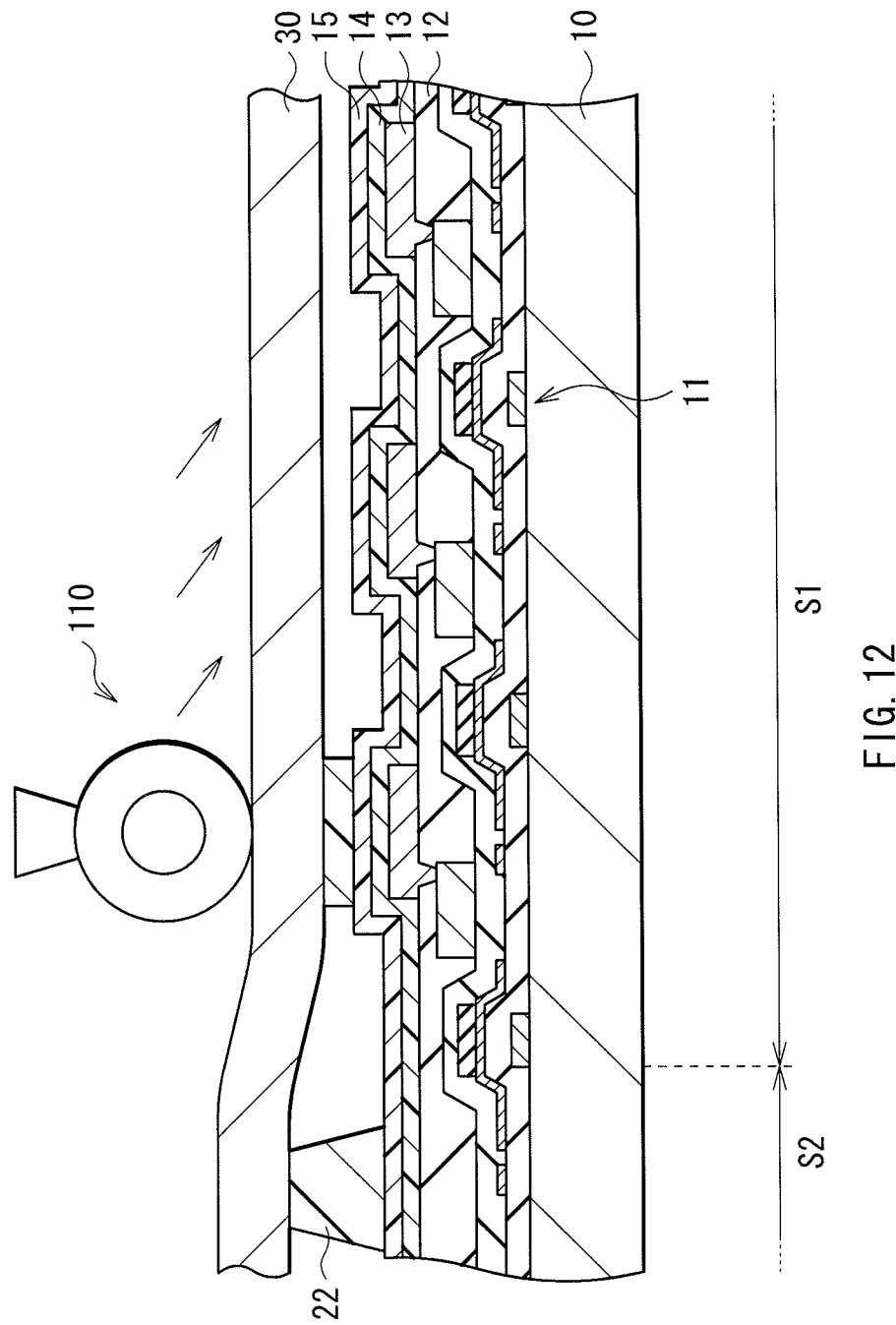
FIG. 12 is a cross-sectional diagram illustrating a process following FIG. 11.

Next, as illustrated in FIG. 12, the blanket 30 (specifically, the red luminous layer 16R formed on the blanket 30) is clamped onto the drive substrate 10A, by using a roller 110 or the like pressed from a back-surface side of the blanket 30, for example.

Figure 13:
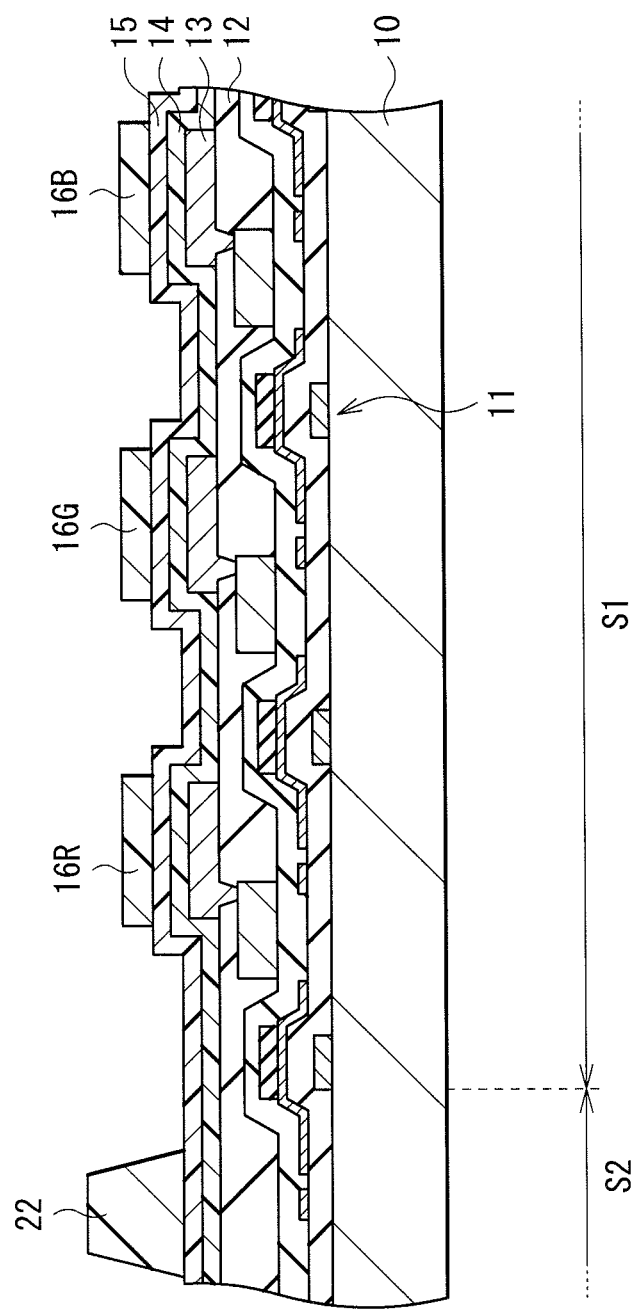
FIG. 13 is a cross-sectional diagram illustrating a process following FIG. 12.

In this process of laying the blanket 30 on the drive substrate 10A, the blanket 30 first contacts with the elongated projection section 22, because the elongated projection section 22 provided in the peripheral region S2 protrudes beyond any of the layers in the light emission region S1. Starting from a point where the blanket 30 is initially in contact with the elongated projection section 22, pressure is sequentially exerted on each of regions in the light emission region S1, thereby allowing the blanket 30 to contact (to be clamped to) these regions. After the clamping, the blanket 30 is removed from the drive substrate 10A, and thereby the red luminous layer 16R is transferred onto the drive substrate 10A (i.e. the red luminous layer 16R is printed on the drive substrate 10A to have a predetermined pattern). Afterwards, each of the green luminous layer 16G and the blue luminous layer 16B is formed on the drive substrate 10A in a similar manner. As a result, the red luminous layer 16R, the green luminous layer 16G, and the blue luminous layer 16B are formed individually for the corresponding pixels, as illustrated in FIG. 13.

Figure 14:
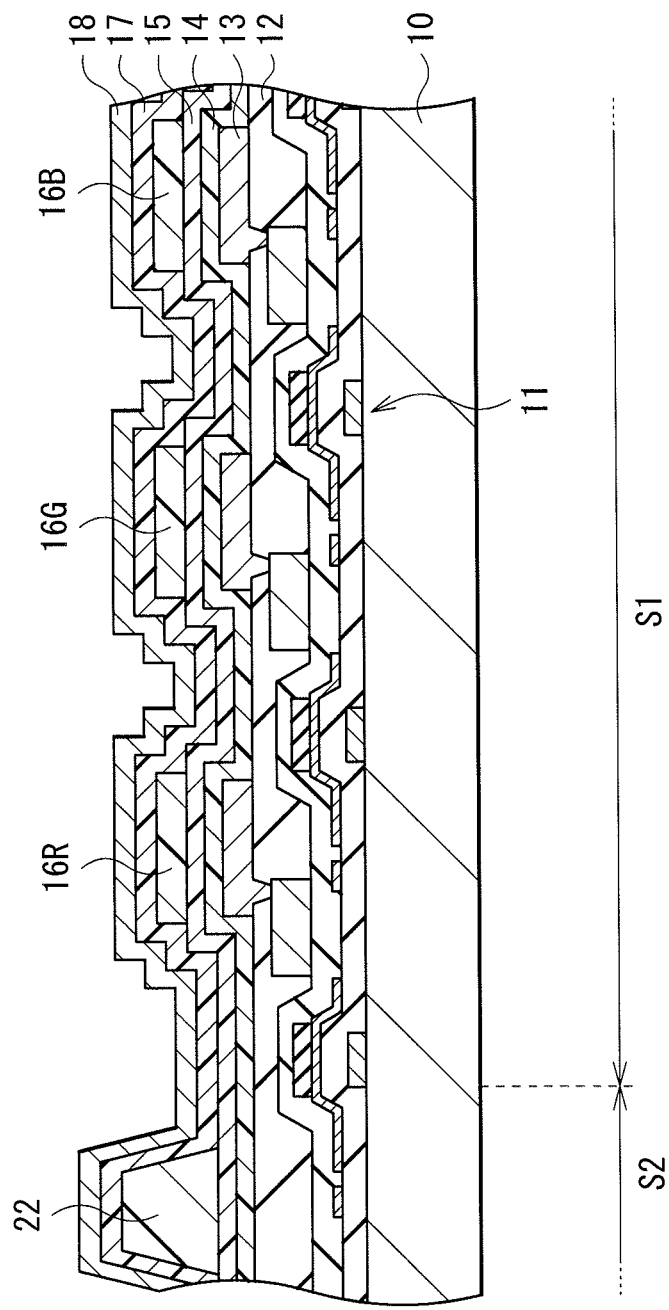
FIG. 14 is a cross-sectional diagram illustrating a process following FIG. 13.

Next, as illustrated in FIG. 14, the electron transport layer 17 and the second electrode 18 made of the materials described above may be formed in this order, over the entire surface on the drive substrate 10A, by vacuum deposition, for example. It is to be noted that an electron injection layer may be formed between the electron transport layer 17 and the second electrode 18. The electron transport layer 17 and the second electrode 18 (as well as the electron injection layer when this electron injection layer is formed) may be continuously formed in the same film-formation system, without being exposed to the atmosphere. Deterioration of the luminous layer due to atmospheric moisture is prevented by such continuous film formation.

Lastly, after the protective layer 19 is formed by vacuum deposition, CVD or the like, the sealing substrate 21 is adhered onto, for instance, the protective layer 19 with the adhesive layer 20 interposed therebetween, for example. This completes the organic EL display device 1 illustrated in FIG. 1.

[Operation and Effects]

In the organic EL display device 1, the scanning signal is supplied from the scanning-line driving circuit 130 to each of the pixels, through the gate electrode of the write transistor Tr2. Also, the image signal supplied from the signal-line driving circuit 120 is retained by the capacitor Cs through the write transistor Tr2. The drive transistor Tr1 is controlled to be on/off, according to the signal retained by this retention capacitor Cs, and thereby a driving current Id is fed into the organic EL elements 10R, 10G, and 10B. As a result, in the organic EL elements 10R, 10G, and 10B, light emission occurs in the luminous layers (16R, 16G, and 16B) by hole-electron recombination. The light thus generated is extracted after passing through the first electrode 13 and the drive substrate 10A, in the case of the bottom emission. Alternatively, the generated light is extracted after passing through the second electrode 18, the color filter (not illustrated), and the sealing substrate 21, in the case of the top emission.

In this organic EL display device 1 of the present embodiment, the luminous layer (the red luminous layer 16R, the green luminous layer 16G, and the blue luminous layer 16B) is formed individually (for example, color-coded) for each of the R, G, and B pixels, and this luminous layer is formed through the printing process by the offset printing. In this offset printing, for example, the print pattern layer 16b formed by being transferred to the flat blanket 30 is laid and then clamped onto the drive substrate 10A, and thereby the printing is performed.

Figure 15A:
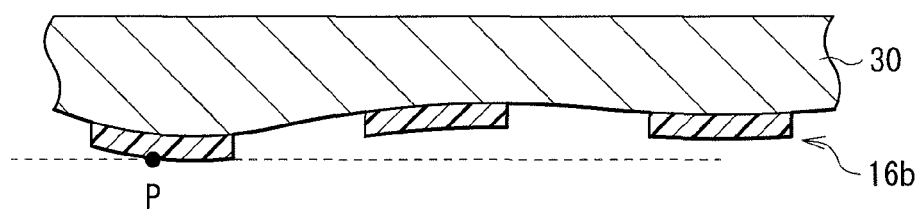
FIGS. 15A to 15C are schematic diagrams used to explain deformation and the like of the blanket.
Figure 15B:
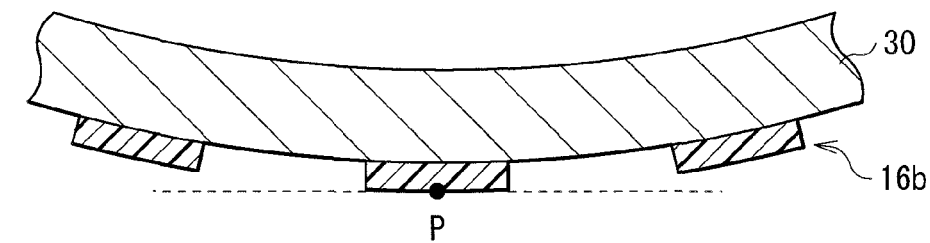
Figure 15C:
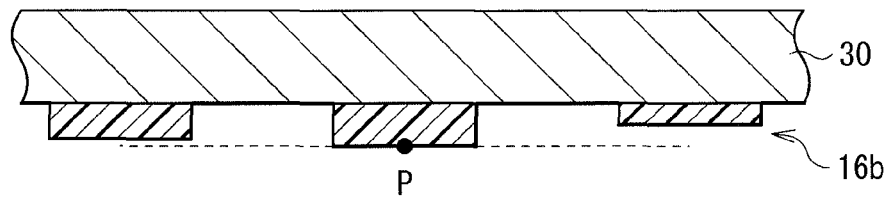

Here, the surface of the blanket 30 may be coated with the silicone rubber or the like as described above. However, when the print pattern layer 16b is formed on this surface, the following failure may occur. That is, when the print pattern layer 16b is formed on the blanket 30, the solvent of the ink is absorbed by the surface, which causes irregularities on the surface of the blanket 30 (FIG. 15A) or causes a deflection in the blanket 30 itself (FIG. 15B). In particular, when the silicone rubber is used for the blanket 30, the solvent is readily absorbed. This causes swelling in a region absorbing a large quantity of the solvent, or causes nonuniformity in the film thickness of the formed print pattern layer 16b (FIG. 15C).

In this way, when deformation or the like occurs in the blanket 30, it is difficult to achieve uniform contact between the blanket 30 and the drive substrate 10A in each region. Specifically, of the print pattern layer 16, a projection P formed in response to the deformation or the like of the blanket 30 initially contacts with the drive substrate 10A (contacts at a random point), when the blanket 30 is laid on the drive substrate 10A. For this reason, in the state of the blanket 30 being laid on the drive substrate 10A (the state before the clamping), a part contacting the drive substrate 10A and a part not contacting the drive substrate 10A are mixedly present in the print pattern layer 16b. When pressure is exerted on one or both of the blanket 30 and the drive substrate 10A in this state, so-called distortion occurs in a border between the contact part and the noncontact part. This causes misalignment of the print pattern layer. In particular, in a high-definition panel for which fine alignment is necessary, it is desired not only to achieve high precision of alignment in the laying of the blanket 30, but also to maintain this high precision of the alignment in the subsequent clamping and detachment. In other words, it is desirable to prevent misalignment from occurring in every process. When the luminous layer is formed as the print pattern layer, such misalignment is visually recognized as color unevenness or color mixture, leading to degradation in the quality of the displayed image.

Therefore, in the present embodiment, the elongated projection section 22 is provided in the part (the part of the peripheral region S2) on the drive substrate 10A. The elongated projection section 22 protrudes further than any of the layers provided between the drive substrate 10A and the print pattern layer 16b (the red luminous layer 16R, the green luminous layer 16G, and the blue luminous layer 16B). This suppresses the occurrence of the distortion in the offset printing process (at the time of clamping the blanket 30) in the light emission region S1. Specifically, before the formation of the print pattern layer 16b, the elongated projection section 22 is so formed as to protrude beyond any of the layers in the light emission region S1. This allows the initial contact between the blanket 30 and the drive substrate 10A to occur at the elongated projection section 22 in the peripheral region S2, thereby preventing the initial contact to take place in the light emission region S1. In the subsequent clamping process, each region in the light emission region S1 is allowed to contact the print pattern layer 16b of the blanket 30 sequentially, starting from the contact point corresponding to this elongated projection section 22. In other words, the location where the distortion occurs is controlled by providing the elongated projection section 22, and thereby the occurrence of the distortion in the light emission region S1 is suppressed. It is to be noted that the distortion may occur in the vicinity of the elongated projection section 22 (in the neighborhood of the border between the contact part and the noncontact part), but this distortion is outside the light emission region S1 and thus does not affect the quality of the image actually displayed.

In the present embodiment, the elongated projection section 22 protruding up to a predetermined height is provided in the peripheral region S2 on the drive substrate 10A, as described above. Therefore, when, for example, the layer of the functional layer such as the luminous layer is formed individually for each pixel, the occurrence of the distortion in the light emission region S1 is suppressed. Thus, degradation in the image quality due to the distortion in the film formation process is suppressed.

Figure 16:
FIG. 16 is a photograph of light emission in an organic EL display device according to an Example.
Figure 17:
FIG. 17 is a photograph of light emission in an organic EL display device according to a comparative example.

Here, FIG. 16 illustrates, as an Example, a photograph of light emission, taken when the organic EL display device 1 having the elongated projection section 22 in the peripheral region S2 of the drive substrate 10A was fabricated in a manner similar to the method described above. It is to be noted that, here, the elongated projection section 22 was formed so that the difference A between the top surface of the elongated projection section 22 and the top surface of the hole transport layer 15 had 500 nm. Also, the elongated projection section 22 was formed at one side of the rectangular shape of the peripheral region S2. FIG. 17 illustrates, as a comparative example, a photograph of light emission, in a case where an organic EL display device was fabricated in a manner similar to the Example, except that the elongated projection section 22 was not provided. In the comparative example in which the elongated projection section 22 was not provided, distortion occurred in the light emission region S1 as illustrated in FIG. 17 and thus, unevenness of the light emission was developed over the entire light emission region S1. On the other hand, in the Example in which the elongated projection section 22 was provided, unevenness of the light emission was greatly reduced because the occurrence of the distortion in the light emission region S1 was suppressed.

[Modification 1]

Figure 18:
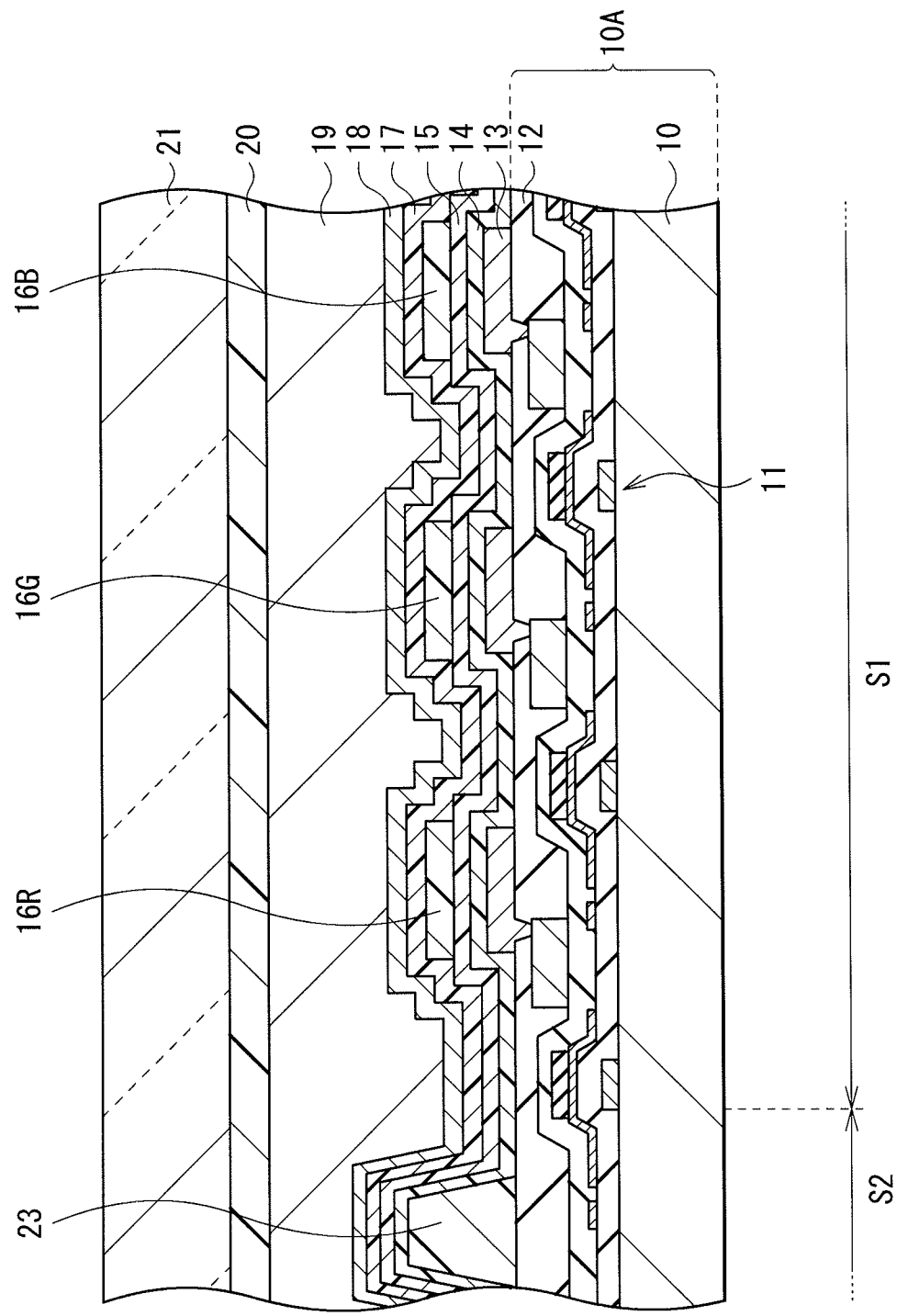
FIG. 18 is a diagram illustrating a cross-sectional configuration of an organic EL display device according to modification 1.

It is to be noted that, in the embodiment described above, among the hole injection layer 14, the hole transport layer 15, the luminous layer (the red luminous layer 16R, the green luminous layer 16G, and the blue luminous layer 16B), and the electron transport layer 17 of the functional layer, the luminous layer is formed as the print pattern layer by the offset printing. In addition, the elongated projection section 22 is provided between the hole transport layer 15 and the luminous layer. However, the elongated projection section 22 is not limited to such a layered structure, as long as the elongated projection section 22 is provided between the luminous layer and the drive substrate 10A. For example, an elongated projection section (an elongated projection section 23) may be provided on the planarizing film 12 of the drive substrate 10A, as illustrated in FIG. 18. In this case, the elongated projection section 23 may be formed to project beyond the first electrode 13, which allows effects equivalent to those in the embodiment to be achieved in the subsequent printing process. In other words, it is good enough for the elongated projection section 23 to be provided between the print pattern layer and the drive substrate 10A (it is only necessary that the elongated projection section 23 be formed prior to the formation of the print pattern layer).

Second Embodiment

Configuration

Figure 19:
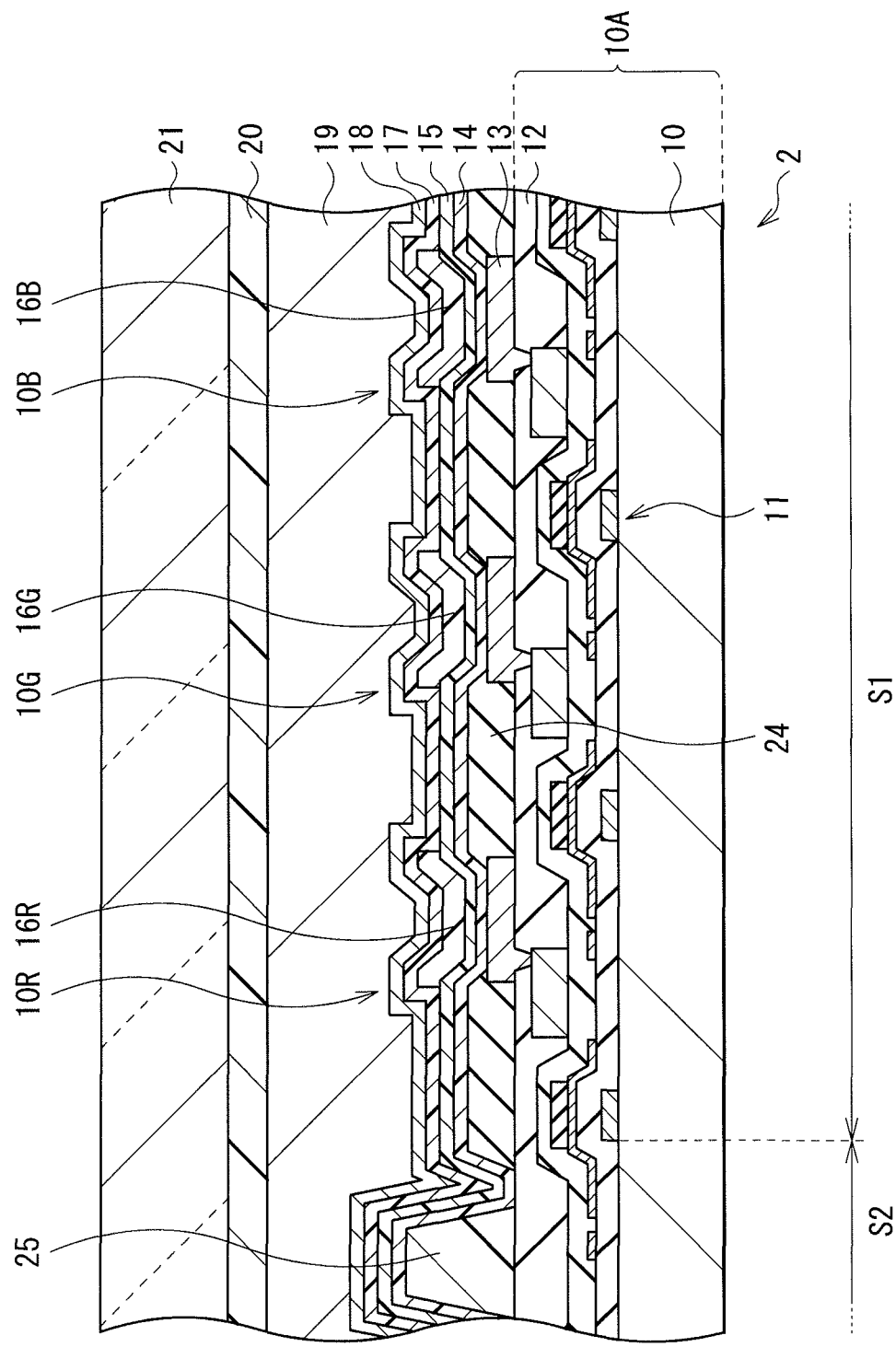
FIG. 19 is a diagram illustrating a cross-sectional configuration of an organic EL display device according to a second embodiment of the disclosure.

FIG. 19 illustrates a cross-sectional configuration of an organic EL display device (an organic EL display device 2) according to a second embodiment of the disclosure. As in the organic EL display device 1 of the first embodiment, the organic EL display device 2 may be used, for example, as an organic EL television or the like capable of performing full color display. In the organic EL display device 2, for example, the organic EL elements 10R, 10G, and 10B are arranged in a matrix on the drive substrate 10A, as a plurality of pixels structuring the light emission region 51. Further, in each of the organic EL elements 10R, 10G, and 10B in the present embodiment, the hole injection layer 14, the hole transport layer 15, the luminous layer (the red luminous layer 16R, the green luminous layer 16G, and the blue luminous layer 16B), and the electron transport layer 17 are also laminated between the first electrode 13 and the second electrode 18 as layers of a functional layer. Furthermore, the luminous layer is a print pattern layer formed by the offset printing, and the elongated projection section 25 is provided in the peripheral region S2 on the drive substrate 10A. It is to be noted that in the following, the same elements as those of the first embodiment will be denoted with the same reference characters as those of the first embodiment, and the description thereof will be omitted as appropriate.

In the present embodiment, the organic EL elements 10R, 10G, and 10B are electrically separated (partitioned) by an inter-pixel insulating film 24 which is a so-called bank. Specifically, the inter-pixel insulating film 24 is provided on the drive substrate 10A and the first electrode 13, and has an opening facing the first electrode 13. Of the functional layer, the hole injection layer 14, the hole transport layer 15, and the electron transport layer 17 are provided on this inter-pixel insulating film 24, as layers common to all the pixels. Each of the red luminous layer 16R, the green luminous layer 16G, and the blue luminous layer 16B is formed in a region facing an opening (the first electrode 13) of the inter-pixel insulating film 24.

The inter-pixel insulating film 24 has a function of suppressing current leakage between the pixels, and reducing an influence on the adjacent pixels when the functional layer is formed. The inter-pixel insulating film 24 is made of photosensitive resin, which is, for example, any of polyimide resin, acrylic resin, novolac resin, and the like. The inter-pixel insulating film 24 has, for instance, a thickness of about 100 nm to about 500 nm both inclusive.

The elongated projection section 25 is provided on a planarizing film 12 of the drive substrate 10A, in the configuration described above. In the present embodiment, the elongated projection section 25 is formed in the same process as that of the inter-pixel insulating film 24. In other words, the elongated projection section 25 is made of the same material as that of the inter-pixel insulating film 24.

Figure 20:
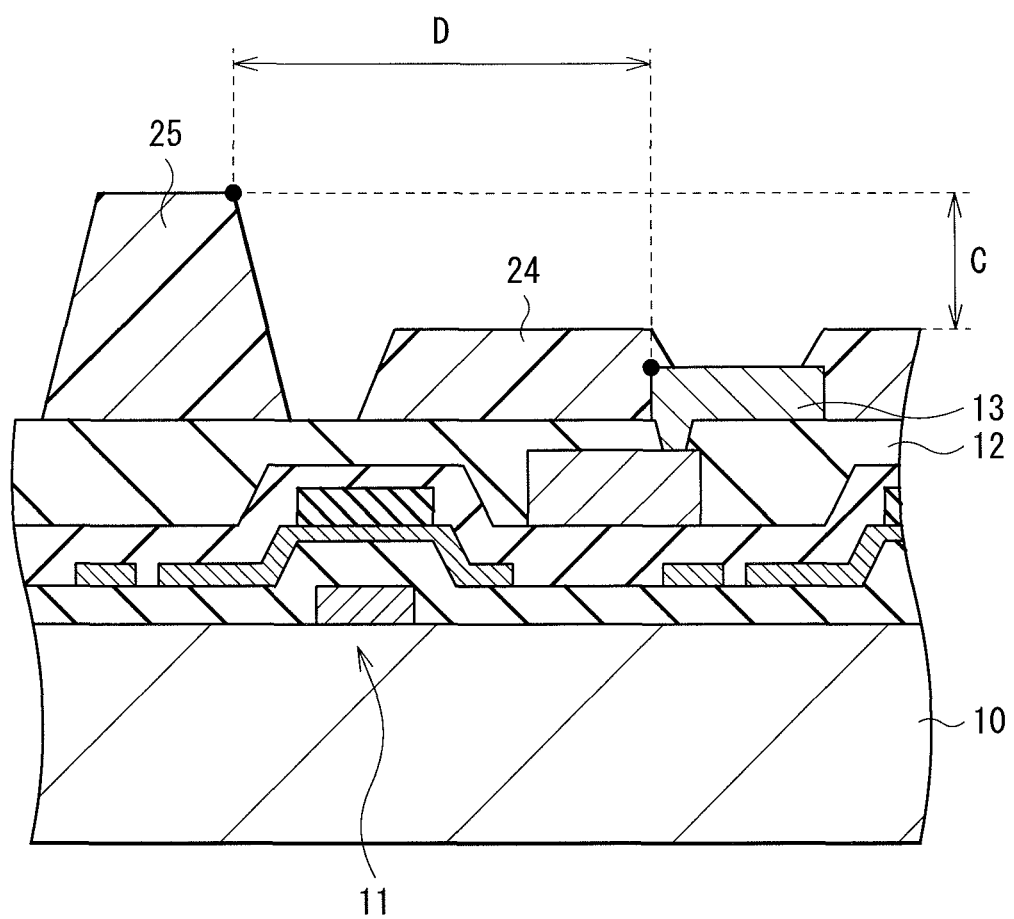
FIG. 20 is an enlarged view of a vicinity of an elongated projection section illustrated in FIG. 19.

FIG. 20 is an enlarged view of a vicinity of the elongated projection section 25. In the present embodiment, each of the red luminous layer 16R, the green luminous layer 16G, and the blue luminous layer 16B is the print pattern layer, as in the first embodiment. However, the elongated projection section 25 is formed to protrude beyond both of the first electrode 13 and the inter-pixel insulating film 24 which are provided between those print pattern layers and the drive substrate 10A. Here, assuming that a difference between a top surface of the elongated projection section 25 (i.e. the uppermost surface in the peripheral region S2) and a top surface of the inter-pixel insulating film 24 (i.e. the uppermost surface in the light emission region S1) is C (nm), it is preferable that the following expression (3) be satisfied for a reason similar to that of the first embodiment.

$$C \geq 500 \tag{3}$$

Further, in a region between the elongated projection section 25 and the light emission region S1 (i.e. in a proximity region of the elongated projection section 25), contact between a blanket and the drive substrate 10A weakens, and therefore, it is preferable to keep a certain distance. Specifically, it is preferable to satisfy the following expression (4), where a distance between a top-surface end part of the elongated projection section 25 and a top-surface end part of the inter-pixel insulating film 24 is D (nm).

$$D \geq C \quad (4)$$

It is to be noted that a location where the elongated projection section 25 is disposed may be provided in any region in a rectangular shape of the peripheral region S2, as with the elongated projection section 22 of the first embodiment.

[Manufacturing Method]

Figure 21:
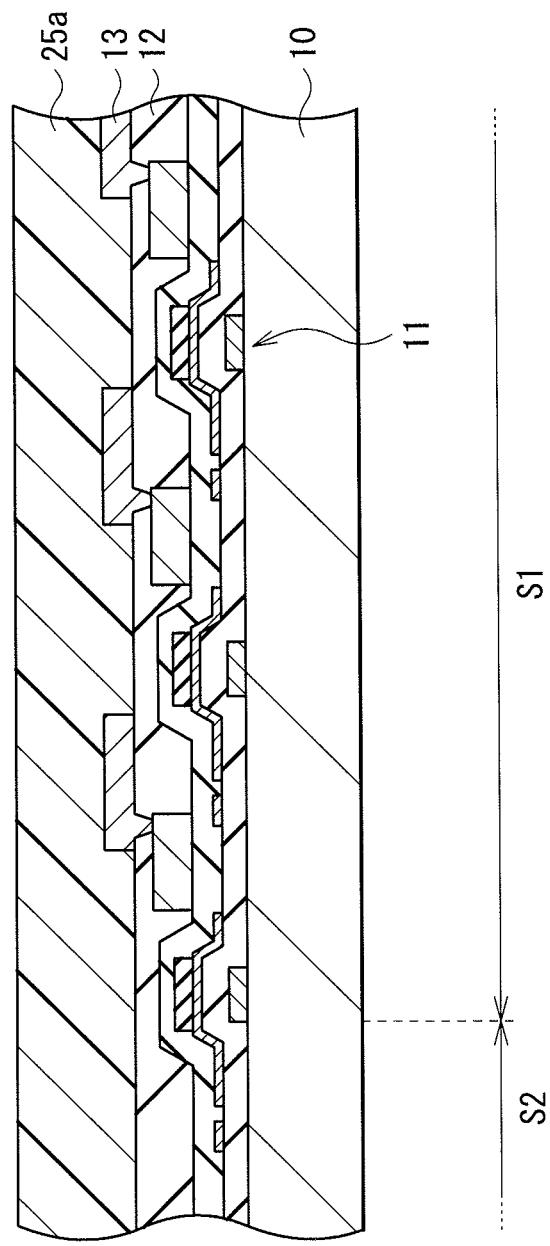
FIG. 21 is a cross-sectional diagram used to explain a method of manufacturing the organic EL display device illustrated in FIG. 19.

The organic EL display device 2 described above may be fabricated as follows. That is, in a manner similar to the first embodiment, after the first electrode 13 is formed on the drive substrate 10A, the elongated projection section 25 is formed in a process of forming the inter-pixel insulating film 24 together. Specifically, first, as illustrated in FIG. 21, a photosensitive resin layer 25a made of the material described above is applied to the entire surface of the drive substrate 10A by spin coating, for example. Here, the film thickness of the photosensitive resin layer 25a is so set as to agree with the film thickness (height) of the elongated projection section 25.

Figure 22:
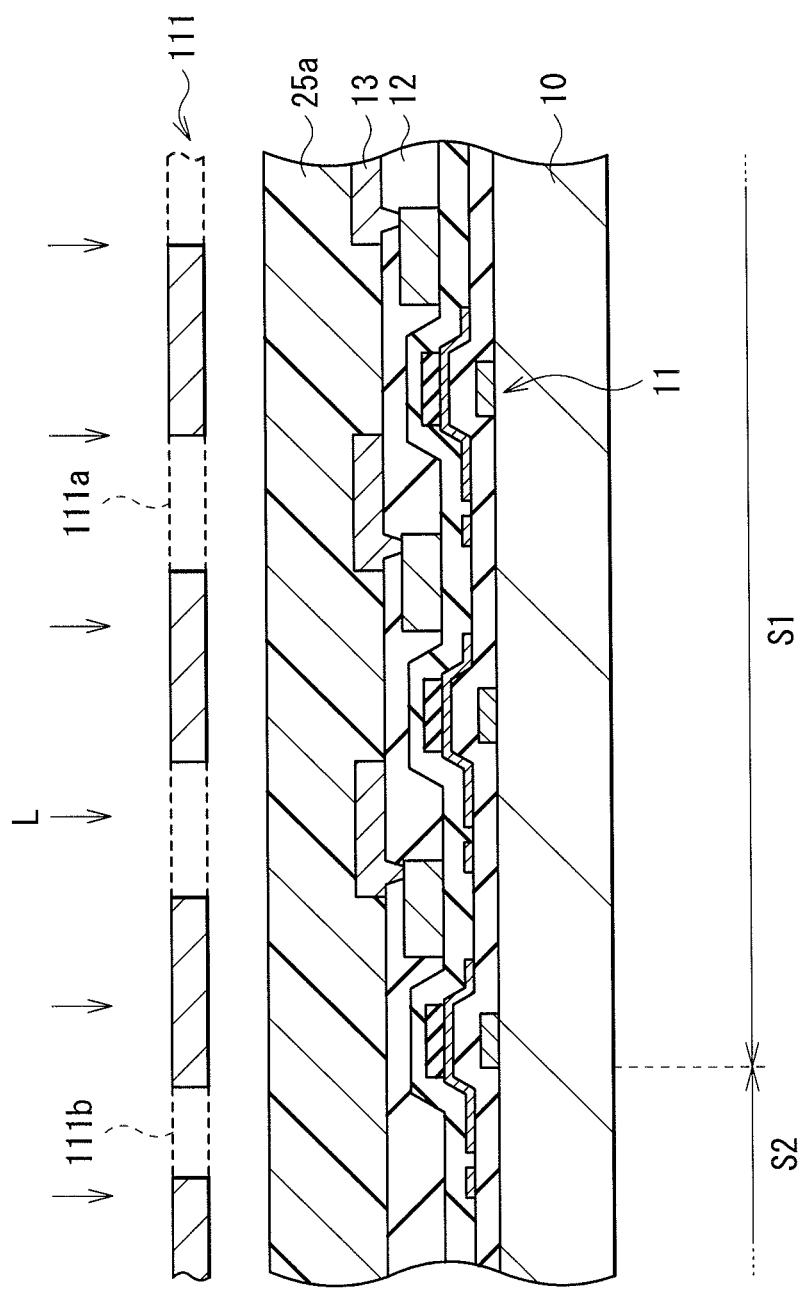
FIG. 22 is a cross-sectional diagram illustrating a process following FIG. 21.

Next, as illustrated in FIG. 22, a selective region of the photosensitive resin layer 25a is exposed by a photolithography method, and thereby the photosensitive resin layer 25a is patterned. For example, the exposure is performed using a predetermined photomask 111 in a case where the photosensitive resin layer 25a is a positive-type photoresist. For instance, a photomask having an opening 111a and an opening 111b is used as the photomask 111. The opening 111a is provided in a region corresponding to the light emission region S1, to face each region where the first electrode 13 is formed. In a region corresponding to the peripheral region S2, the opening 111b is provided in a region where the elongated projection section 25 is not to be formed. Thus, of the photosensitive resin layer 25a, each part facing the first electrode 13 is selectively removed, while each part corresponding to the elongated projection section 25 remains.

Figure 23:
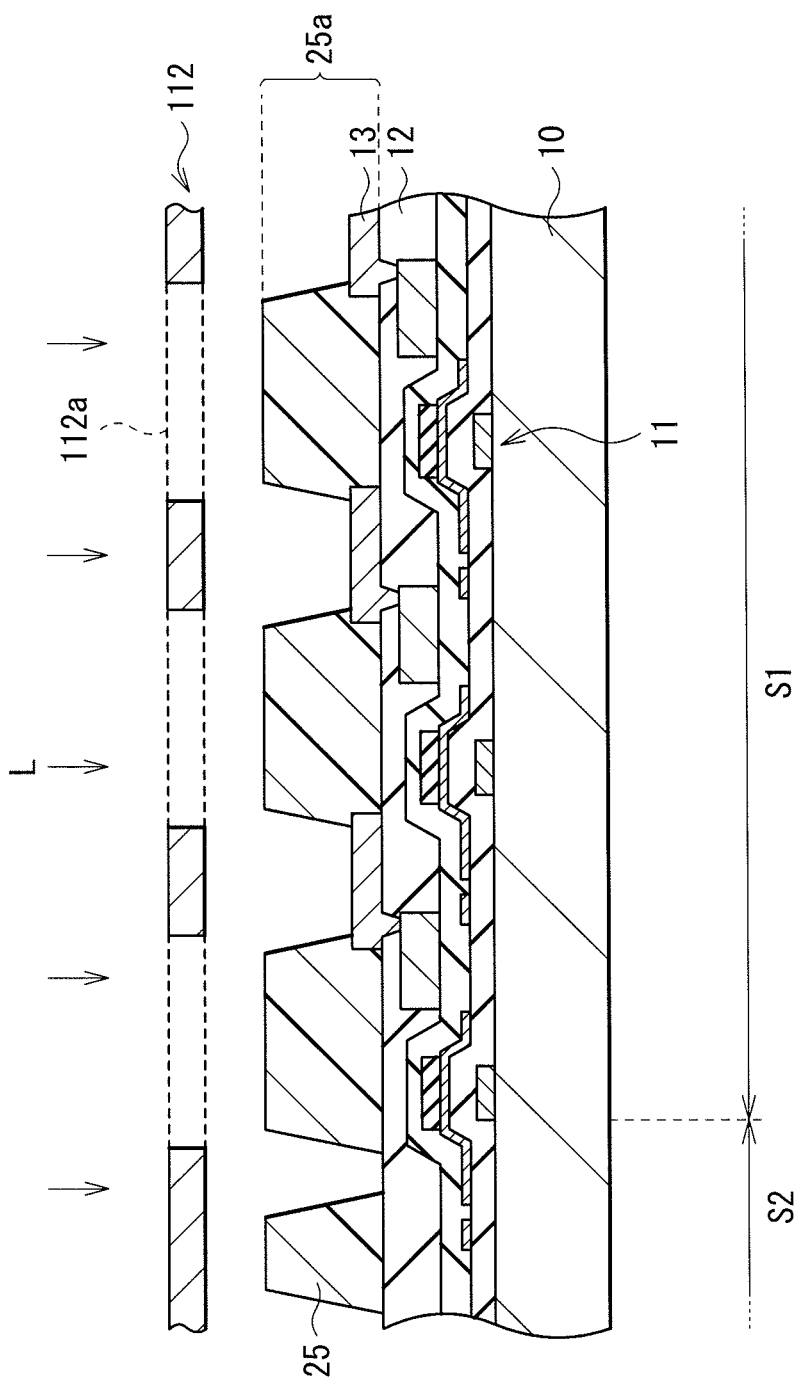
FIG. 23 is a cross-sectional diagram illustrating a process following FIG. 22.
Figure 24:
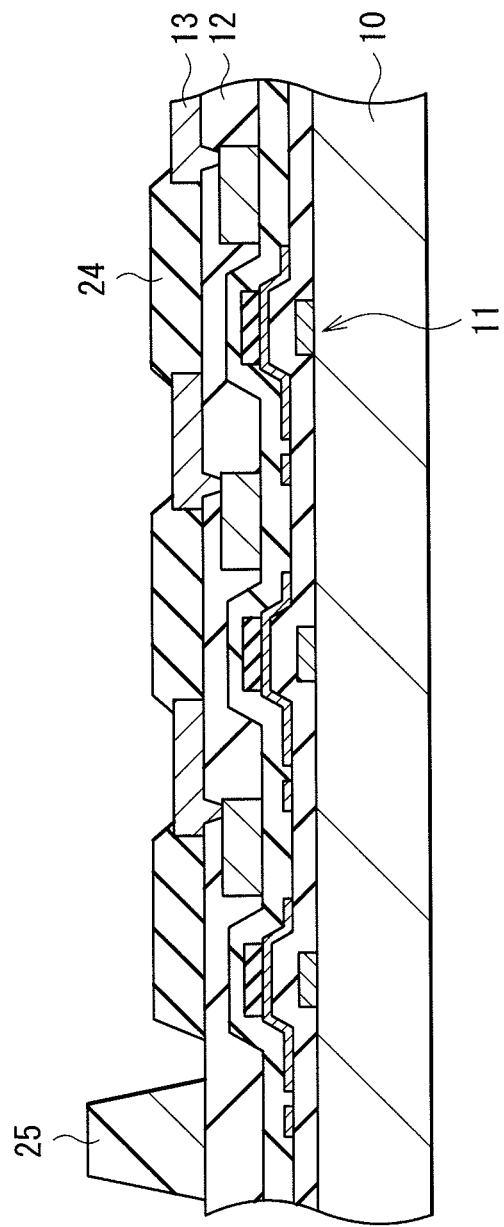
FIG. 24 is a cross-sectional diagram illustrating a process following FIG. 23.

Next, as illustrated in FIG. 23, the elongated projection section 25 formed in the peripheral region S2 and the photosensitive resin layer 25a partially removed in the light emission region S1 in the previous process are exposed again (half exposed), using a predetermined photomask 112. For instance, a photomask used as the photomask 112 has an opening 112a facing each region where the first electrode 13 is not formed, in a region corresponding to the light emission region S1. The photomask has no opening in a region corresponding to the peripheral region S2. This removes an upper part of the photosensitive resin layer 25a in the light emission region S1, thereby reducing a film thickness. Thus, as illustrated in FIG. 24, the inter-pixel insulating film 24 and the elongated projection section 25 are formed in the light emission region Si and the peripheral region S2, respectively, in the same process.

Figure 25:
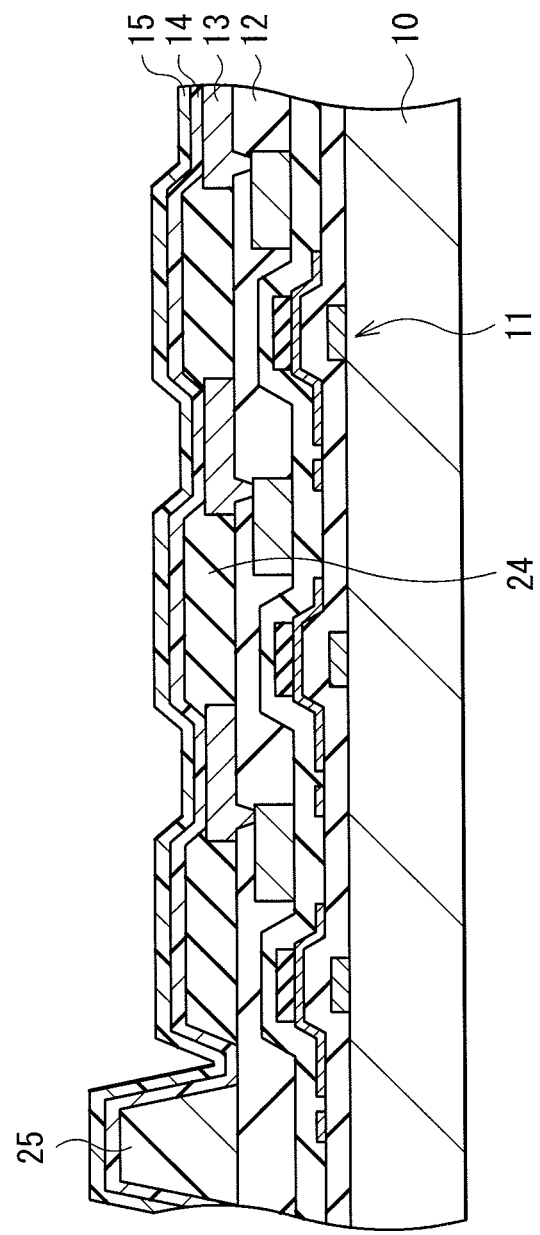
FIG. 25 is a cross-sectional diagram illustrating a process following FIG. 24.

As illustrated in FIG. 25, subsequently, the hole injection layer 14 and the hole transport layer 15 are formed in a manner similar to the first embodiment.

Figure 26:
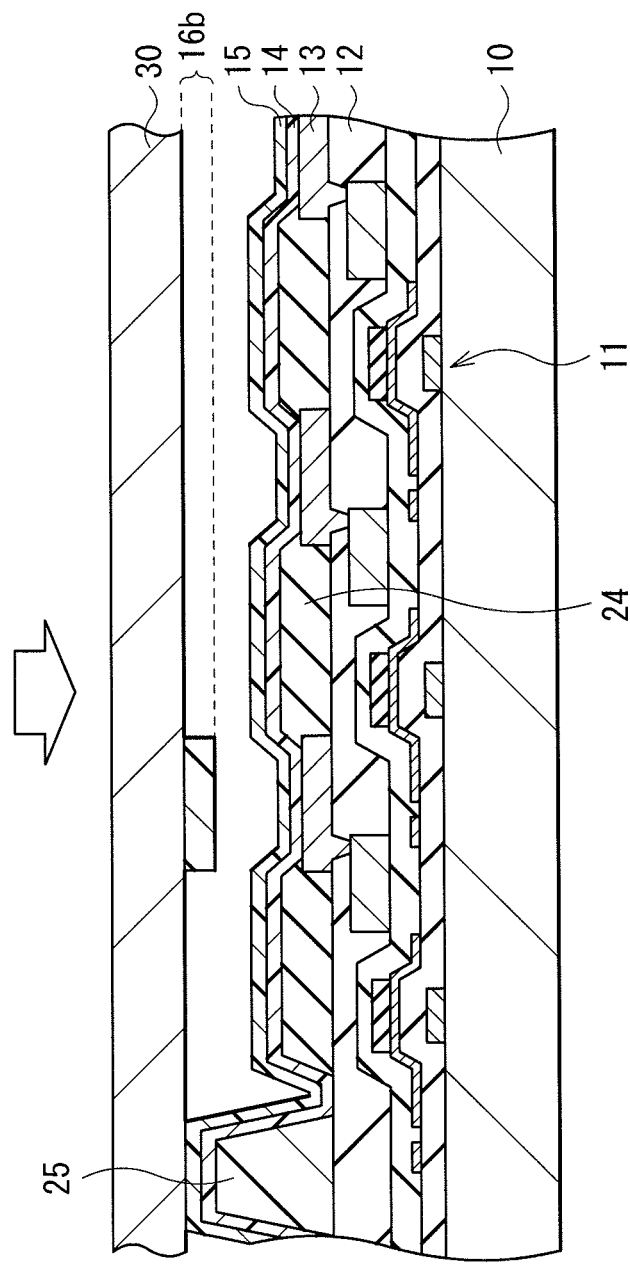
FIG. 26 is a cross-sectional diagram illustrating a process following FIG. 25.
Figure 27:
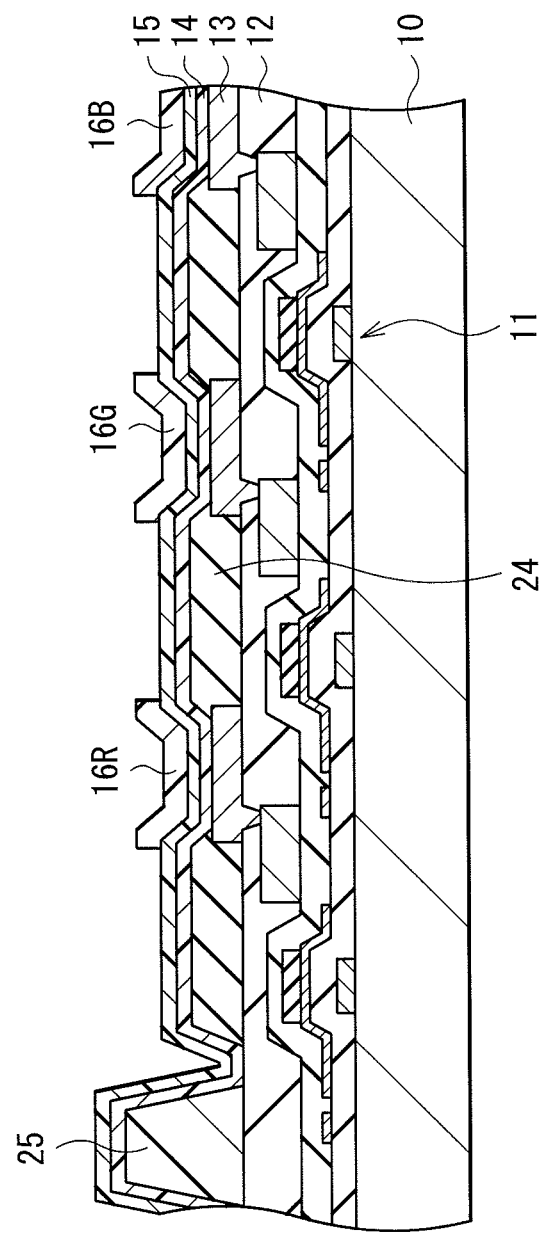
FIG. 27 is a cross-sectional diagram illustrating a process following FIG. 26.

Next, the red luminous layer 16R, the green luminous layer 16G, and the blue luminous layer 16B are formed using the offset printing, in a manner similar to the first embodiment. For example, as illustrated in FIG. 26, the blanket 30 having the print pattern layer 16b where pattern formation of the red luminous layer 16R has been performed is laid on the drive substrate 10A and then clamped. Here, in the present embodiment, because the elongated projection section 25 is provided, the initial contact between the drive substrate 10A and the blanket 30 takes place at the elongated projection section 25. Therefore, the occurrence of the initial contact in the light emission region S1 is avoided as in the first embodiment. Each of the green luminous layer 16G and the blue luminous layer 16B is formed in a similar manner. Thus, as illustrated in FIG. 27, the red luminous layer 16R, the green luminous layer 16G, and the blue luminous layer 16B are formed individually on the drive substrate 10A.

Next, in a manner similar to the first embodiment, the electron transport layer 17, the second electrode 18, and the protective layer 19 are formed, and the sealing substrate 21 is adhered onto the protective layer 19 with the adhesive layer 20 interposed therebetween. This completes the organic EL display device 2 illustrated in FIG. 19.

In the present embodiment, the elongated projection section 25 protruding further than the first electrode 13 and the inter-pixel insulating film 24 is provided in a part of the peripheral region S2 on the drive substrate 10A. Thus, the occurrence of distortion in the light emission region S1 is suppressed, as in the first embodiment. Therefore, effects equivalent to those in the first embodiment are achieved. Further, in the present embodiment, the inter-pixel insulating film 24 is provided, and the elongated projection section 25 is produced in a process of forming the inter-pixel insulating film 24 together. Therefore, it is not necessary to provide a process of forming the elongated projection section 25 separately, allowing a reduction in the number of production processes.

[Modification 2]

Figure 28:
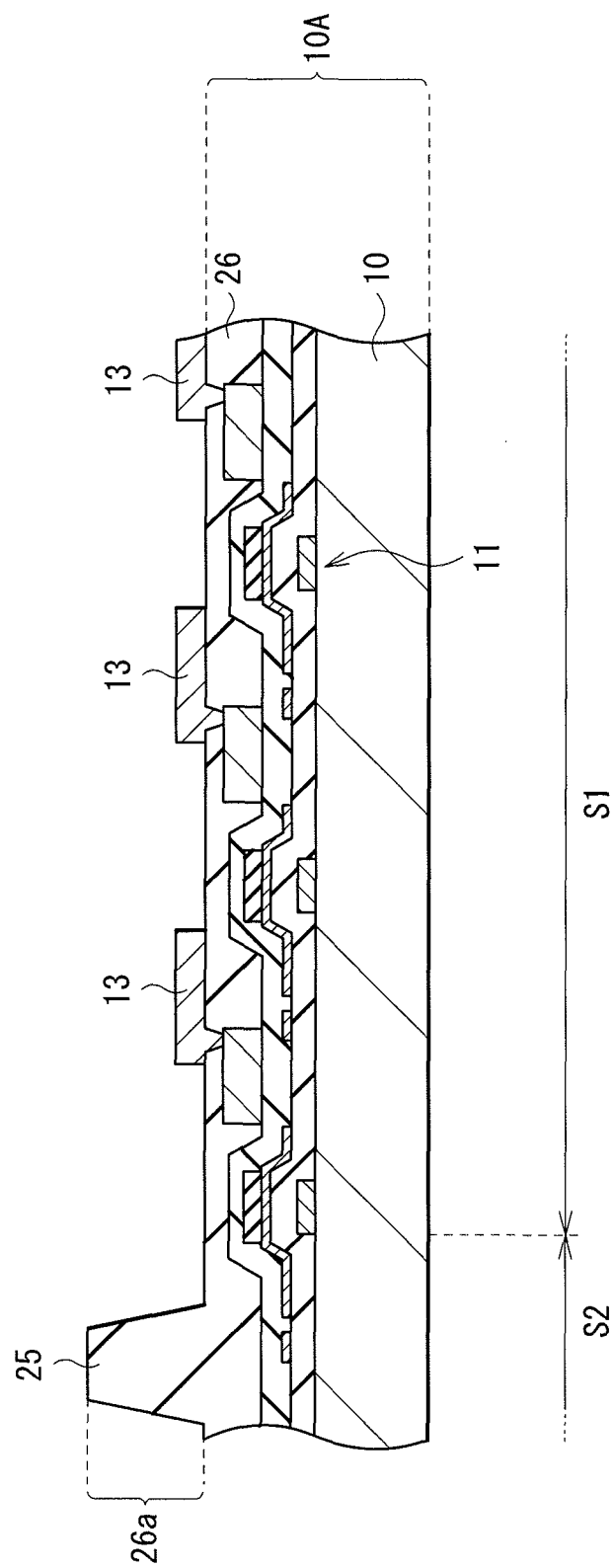
FIG. 28 is a diagram illustrating a cross-sectional configuration of an organic EL display device according to modification 2.

It is to be noted that the second embodiment has been described for the case where the inter-pixel insulating film 24 and the elongated projection section 25 are formed in the same process. However, when the drive substrate 10A is planarized by a planarizing film (a planarizing film 26), the planarizing film 26 and an elongated projection section (an elongated projection section 26a) may be formed in the same process. In other words, as illustrated in FIG. 28, the planarizing film 26 and the elongated projection section 26a may be formed integrally (using the same material). The planarizing film 26 and the elongated projection section 26a are made of, for example, any of polyimide resin, acrylic resin, novolac resin, and the like. The planarizing film 26 and the elongated projection section 26a may be formed by undergoing the two-stage exposure process using the predetermined photomasks, as in the process of forming the inter-pixel insulating film 24 and the elongated projection section 25 in the second embodiment. Effects equivalent to those in the first embodiment and the modification 2 are also achieved in this configuration.

APPLICATION EXAMPLES

Now, description is provided on application examples to which the organic EL display device in any of the embodiments and the modifications is applicable. The organic EL display device according to any of the embodiments and the modifications may be applied to electronic units in all fields, which display externally-input image signals or internally-generated image signals as still or moving images. The electronic units include television receivers, digital cameras, laptop computers, portable terminals such as portable telephones, video cameras, and the like.

(Module)

Figure 29:
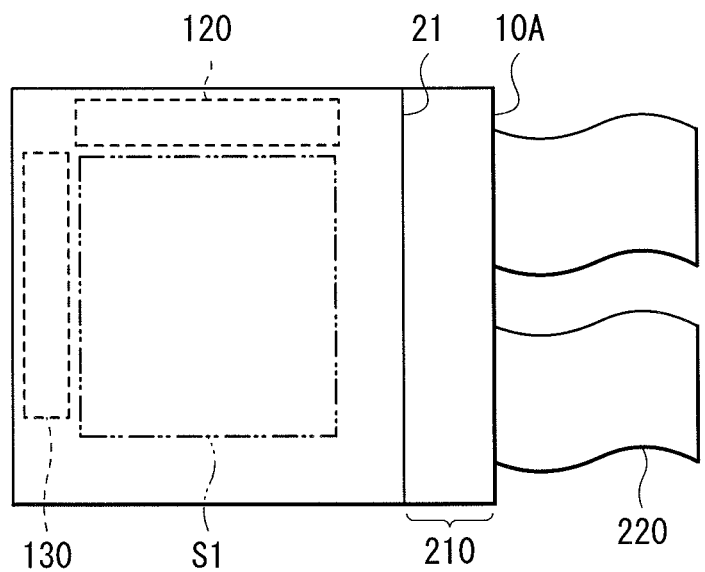
FIG. 29 is a plan view illustrating a schematic configuration of a module including the display according to any of the embodiments and the modifications.

For instance, the organic EL display device in any of the embodiments and the modifications is incorporated, as a module illustrated in FIG. 29, into any of various kinds of electronic unit such as application examples 1 to 5 which will be described later. This module is formed, for example, by providing a region 210 exposed at one side of the drive substrate 10A from the sealing substrate 21. In this exposed region 210, an external connection terminal (not illustrated) is formed by extending wires of the signal-line driving circuit 120 and the scanning-line driving circuit 130. This external connection terminal may be provided with a flexible printed circuit (FPC) 220 for input and output of signals.

Application Example 1

Figure 30:
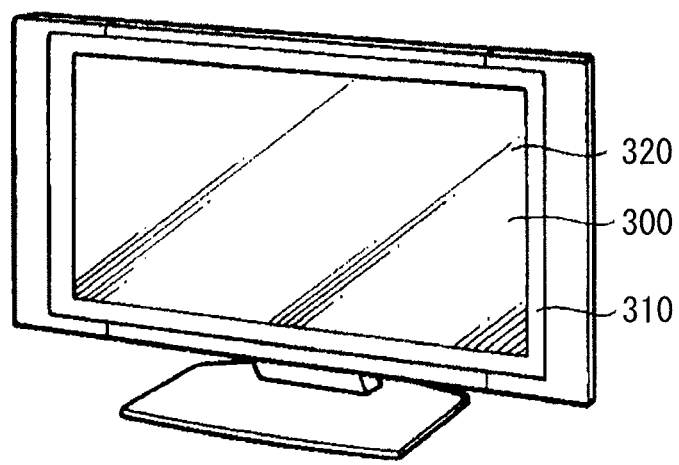
FIG. 30 is a perspective diagram illustrating an appearance of application example 1 of the display according to any of the embodiments and the modifications.

FIG. 30 is an external view of a television receiver according to the application example 1. This television receiver has, for example, an image-display screen section 300 that includes a front panel 310 and a filter glass 320. The image-display screen section 300 is configured using the organic EL display device in any of the embodiments and the modifications.

Application Example 2

Figure 31A:
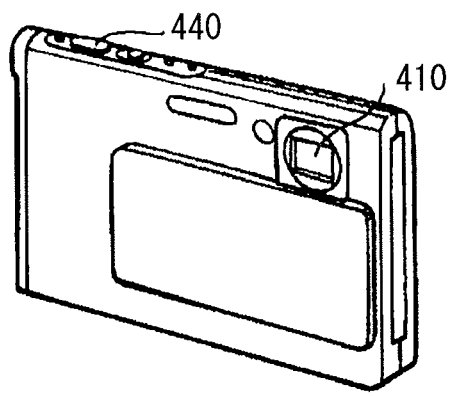
FIGS. 31A and 31B are perspective diagrams of application example 2, namely.
Figure 31B:
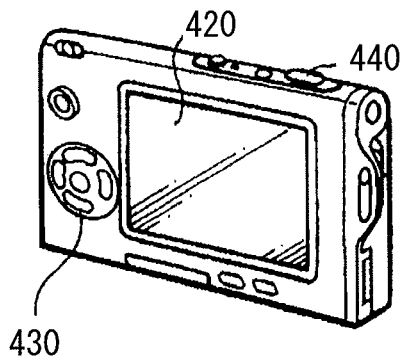

FIGS. 31A and 31B are external views of a digital camera according to the application example 2. This digital camera includes, for example, a flash emitting section 410, a display section 420, a menu switch 430, and a shutter release 440. The display section 420 is configured using the organic EL display device in any of the embodiments and the modifications.

Application Example 3

Figure 32:
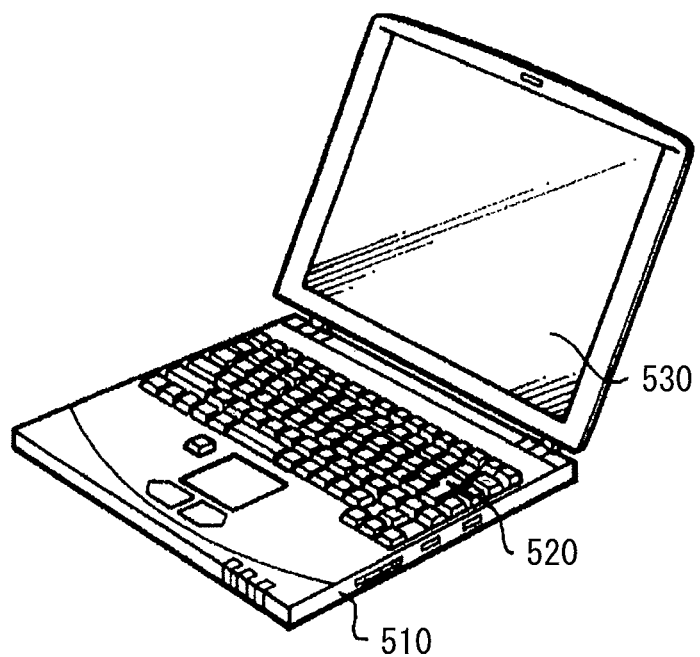
FIG. 32 is a perspective diagram illustrating an appearance of application example 3.

FIG. 32 is an external view of a laptop computer according to the application example 3. This laptop computer includes, for example, a main section 510, a keyboard 520 provided to enter characters and the like, and a display section 530 displaying an image. The display section 530 is configured using the organic EL display device in any of the embodiments and the modifications.

Application Example 4

Figure 33:
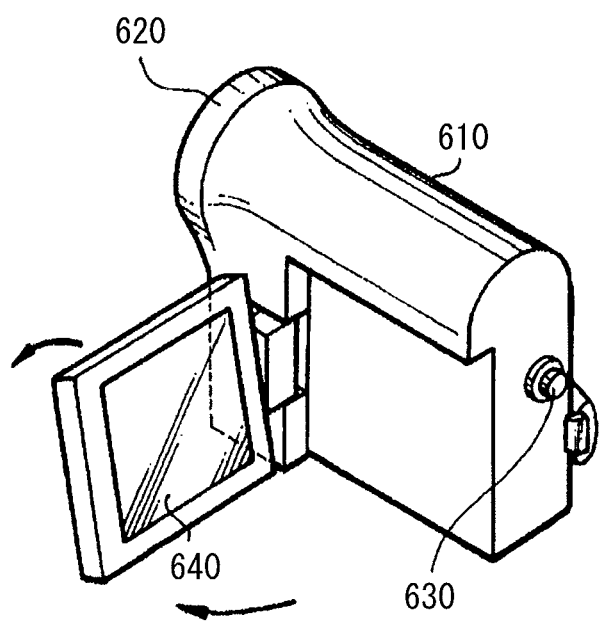
FIG. 33 is a perspective diagram illustrating an appearance of application example 4.

FIG. 33 is an external view of a video camera according to the application example 4. This video camera includes, for example, a main section 610, a lens 620 disposed on a front face of this main section 610 to shoot an image of a subject, a start/stop switch 630 in shooting, and a display section 640. The display section 640 is configured using the organic EL display device in any of the embodiments and the modifications.

Application Example 5

FIGS. 34A to 34G are external views of a portable telephone according to the application example 5. This portable telephone is, for example, a unit in which an upper housing 710 and a lower housing 720 are connected by a coupling section (a hinge section) 730, and includes a display 740, a sub-display 750, a picture light 760, and a camera 770. The display 740 or the sub-display 750 is configured using the organic EL display device in any of the embodiments and the modifications.

The present application has been described with reference to the embodiments, the modifications, and the application examples, but is not limited thereto and may be variously modified. For example, the material and thickness of each layer, or the film formation methods and conditions described in each of the embodiments, the modifications, and the application examples are not limited. Alternatively, other material and thickness, or other film formation methods and conditions may be employed.

Further, in each of the embodiments, the modifications, and the application examples, the case where the elongated projection section (protrusion) is provided in the peripheral region S2 on the drive substrate 10A has been taken as an example. However, the protrusion is not necessarily provided in the peripheral region S2, and may be provided in the light emission region S1. Even in this case, distortion is caused by initial contact in the vicinity of the protrusion, and thereby occurrence of distortion in other regions of the light emission region S1 is suppressed. In other words, the occurrence of the distortion is restricted to only a local region around the projection, or the distortion is controlled to occur in a predetermined region within the light emission region S1. This allows suppression of the occurrence of the distortion in a specific region that readily affects the quality of a displayed image. However, it is preferable to provide the protrusion in the peripheral region S2, because this allows suppression of the occurrence of the distortion in the entire light emission region S1.

Furthermore, in each of the embodiments, the modifications, and the application examples, the elongated projection section, which is shaped like a line extending in one direction, is taken as an example of the protrusion according to one embodiment of the application, although it is not necessarily shaped like a line. Alternatively, protrusions scattered in selective regions on the drive substrate 10A may be used. However, in the case of employing the line-shaped protrusion, it is easier to form the point starting the contact between the blanket and the drive substrate, and higher stability is achieved. Therefore, the print pattern layer is formed with high accuracy.

Still furthermore, in each of the embodiments, the modifications, and the application examples, the case where the luminous layer is the print pattern layer serving as a part of the functional layer has been taken as an example. However, the disclosure is not limited to this example. Alternatively, other organic layers, for example, one or more layers among the hole injection layer 14, the hole transport layer 15, and the electron transport layer 17, may be formed as the print pattern layer by the offset printing.

In addition, in each of the embodiments, the modifications, and the application examples, the configuration of the organic EL elements 10R, 10G, and 10B has been specifically described. However, it is not necessary to provide all the layers, or other layers may be further provided. Further, in each of the embodiments, the modifications, and the application examples, there has been described the display device that includes the red organic EL element and the green organic EL element as the organic EL element of the colors besides blue. However, the disclosure is not limited to this example, and applicable to any type of display device in which a functional layer is formed by using a printing method. For example, the disclosure is applicable to a display device including a blue organic EL element and a yellow organic EL element.

Moreover, in each of the embodiments, the modifications, and the application examples, the case where the display device is of the active matrix type has been described. However, the disclosure is also applicable to a display device of a passive matrix type. Further, the configuration of the pixel driving circuit for active matrix driving is not limited to those described in the embodiments. Alternatively, a capacitive device and a transistor may be added as necessary. In that case, in addition to the signal-line driving circuit 120 and the scanning-line driving circuit 130 described above, a necessary drive circuit may be provided according to a change made to the pixel driving circuit.

In addition, in each of the embodiments, the modifications, and the application examples, the case where the organic EL display device is of the top emission type or the bottom emission type has been described. However, the disclosure is also applicable to an organic EL display device of a type extracting light from both of a top surface and a bottom surface.

Accordingly, it is possible to achieve at least the following configurations (1) to (19) from the above-described example embodiments, the modifications, and the application examples of the disclosure.

(1) An organic electroluminescence display device, including:

a light emission region including a plurality of pixels on a drive substrate, each of the pixels including, in order from a side close to the drive substrate, a first electrode, a functional layer, and a second electrode, the first electrode being provided for each of the pixels, and the functional layer including at least an organic electroluminescence layer;

a print pattern layer included in the functional layer and being formed individually for each of the pixels; and a protrusion provided on the drive substrate and protruding further than any layer provided between the print pattern layer and the drive substrate.

(2) The organic electroluminescence display device according to (1), wherein the protrusion is provided in a part of a peripheral region of the light emission region on the drive substrate.

(3) The organic electroluminescence display device according to (1) or (2), wherein the drive substrate has a rectangular shape in plane, and the protrusion includes at least one elongated projection section provided along one or more sides of the rectangular shape, in the peripheral region.

(4) The organic electroluminescence display device according to (3), wherein the at least one elongated projection section is provided along each of two opposed sides of the rectangular shape, in the peripheral region.

(5) The organic electroluminescence display device according to (3), wherein the at least one elongated projection section is provided along every side of the rectangular shape, in the peripheral region.

(6) The organic electroluminescence display device according to any one of (1) to (5), further including a pixel separation film including openings, wherein the first electrodes and the pixel separation film are provided in this order from the side close to the drive substrate, the openings of the pixel separation film oppose the respective first electrodes, and the protrusion includes a resin material substantially same as a material of the pixel separation film.

(7) The organic electroluminescence display device according to any one of (1) to (5), further including a planarizing film provided on a surface of the drive substrate, wherein the protrusion includes a resin material substantially same as a material of the planarizing film.

(8) The organic electroluminescence display device according to any one of (1) to (7), wherein the protrusion includes one of a polyimide resin, an acrylic resin, and a novolac resin.

(9) A method of manufacturing an organic electroluminescence display device, the method including:

forming a plurality of first electrodes, a functional layer including at least an organic electroluminescence layer, and a second electrode in this order in a light emission region on a drive substrate to thereby form a plurality of pixels, a print pattern layer formed individually for each of the pixels being formed as a part of the functional layer; and forming a protrusion on the drive substrate, the protrusion being formed to protrude further than any layer formed on the drive substrate before the formation of the print pattern layer.

(10) The method of manufacturing the organic electroluminescence display device according to (9), wherein the print pattern layer is formed using offset printing.

(11) The method of manufacturing the organic electroluminescence display device according to (10), wherein the offset printing includes one of a flat blanket and a sheet-like blanket.

(12) The method of manufacturing the organic electroluminescence display device according to (10) or (11), wherein in the offset printing includes forming the print pattern layer on the blanket, and laying thereafter the blanket on the drive substrate with the print pattern layer interposed therebetween and clamping the blanket.

(13) The method of manufacturing the organic electroluminescence display device according to (11) or (12), wherein the blanket includes, at least on a surface of the blanket, a layer having a silicone rubber.

(14) The method of manufacturing the organic electroluminescence display device according to any one of (11) to (13), wherein the blanket is supported by a rigid member.

(15) The method of manufacturing the organic electroluminescence display device according to any one of (9) to (14), wherein the protrusion is formed in a part of a peripheral region of the light emission region on the drive substrate.

(16) The method of manufacturing the organic electroluminescence display device according to any one of (9) to (15), further including forming a pixel separation film on the drive substrate after the formation of the first electrodes, the pixel separation film having openings that oppose the respective first electrodes, wherein the protrusion is formed in the forming of the pixel separation film together.

(17) The method of manufacturing the organic electroluminescence display device according to any one of (9) to (15), further including forming a planarizing film on a surface of the drive substrate before the formation of the first electrodes, wherein the protrusion is formed in the forming of the planarizing film together.

(18) The method of manufacturing the organic electroluminescence display device according to any one of (9) to (17), wherein a material of the protrusion includes one of a polyimide resin, an acrylic resin, and a novolac resin.

(19) An electronic system with an organic electroluminescence display device, the organic electroluminescence display device including:

a light emission region including a plurality of pixels on a drive substrate, each of the pixels including, in order from a side close to the drive substrate, a first electrode, a functional layer, and a second electrode, the first electrode being provided for each of the pixels, and the functional layer including at least an organic electroluminescence layer;

a print pattern layer included in the functional layer and being formed individually for each of the pixels; and a protrusion provided on the drive substrate and protruding further than any layer provided between the print pattern layer and the drive substrate.

It should be understood that various changes and modifications to the presently preferred embodiments described The invention is claimed as follows:

1. An organic electroluminescence display device, comprising:
a light emission region including a plurality of pixels on a drive substrate, each of the pixels including, in order from a side close to the drive substrate, a first electrode, a functional layer, and a second electrode, the first electrode being provided for each of the pixels, and the functional layer including an organic electroluminescence layer;
a print pattern layer included in the functional layer and being formed individually for each of the pixels; and
a protrusion provided on the drive substrate and protruding further than any layer provided between the print pattern layer and the drive substrate, wherein the protrusion extends from a point that is a first distance from the drive substrate to a point that is a second distance from the drive substrate, wherein the organic electroluminescence layer is located farther from the drive substrate than the first distance and closer to the drive substrate than the second distance; and
wherein the protrusion is not placed between any two pixels of the light emission region.

2. The organic electroluminescence display device according to claim 1, wherein the protrusion is provided in a part of a peripheral region of the light emission region on the drive substrate.

3. The organic electroluminescence display device according to claim 2, wherein
the drive substrate has a rectangular shape in plane, and
the protrusion includes at least one elongated projection section provided along one or more sides of the rectangular shape, in the peripheral region.

4. The organic electroluminescence display device according to claim 3, wherein the at least one elongated projection section is provided along each of two opposed sides of the rectangular shape, in the peripheral region.

5. The organic electroluminescence display device according to claim 3, wherein the at least one elongated projection section is provided along every side of the rectangular shape, in the peripheral region.

6. An organic electroluminescence display device, comprising:
a light emission region including a plurality of pixels on a drive substrate, each of the pixels including, in order from a side close to the drive substrate, a first electrode, a functional layer, and a second electrode, the first electrode being provided for each of the pixels, and the functional layer including an organic electroluminescence layer;
a print pattern layer included in the functional layer and being formed individually for each of the pixels; and
a protrusion provided on the drive substrate and protruding further than any layer provided between the print pattern layer and the drive substrate, wherein the protrusion extends from a point that is a first distance from the drive substrate to a point that is a second distance from the drive substrate, wherein the organic electroluminescence layer is located farther from the drive substrate than the first distance and closer to the drive substrate than the second distance;

a pixel separation film including openings,
wherein the first electrodes and the pixel separation film are provided in this order from the side close to the drive substrate,
the openings of the pixel separation film oppose the respective first electrodes, and
the protrusion includes a resin material that is substantially the same as a material of the pixel separation film.

7. The organic electroluminescence display device according to claim 1, further comprising a planarizing film provided on a surface of the drive substrate,
wherein the protrusion includes a resin material substantially same as a material of the planarizing film.

8. The organic electroluminescence display device according to claim 1, wherein the protrusion includes one of a polyimide resin, an acrylic resin, and a novolac resin.

9. A method of manufacturing an organic electroluminescence display device, the method comprising:
forming a plurality of first electrodes, a functional layer including at least an organic electroluminescence layer, and a second electrode in this order in a light emission region on a drive substrate to thereby form a plurality of pixels, a print pattern layer formed individually for each of the pixels being formed as a part of the functional layer; and
forming a protrusion on the drive substrate, the protrusion being formed to protrude further than any layer formed on the drive substrate before the formation of the print pattern layer, wherein the protrusion extends from a point that is a first distance from the drive substrate to a point that is a second distance from the drive substrate, wherein the organic electroluminescence layer is located farther from the drive substrate than the first distance and closer to the drive substrate than the second distance; and
wherein the protrusion is not placed between any two pixels of the light emission region.

10. The method of manufacturing the organic electroluminescence display device according to claim 9, wherein the print pattern layer is formed using offset printing.

11. The method of manufacturing the organic electroluminescence display device according to claim 10, wherein the offset printing includes one of a flat blanket and a sheet-like blanket.

12. The method of manufacturing the organic electroluminescence display device according to claim 11, wherein the offset printing includes forming the print pattern layer on the blanket, and laying thereafter the blanket on the drive substrate with the print pattern layer interposed therebetween and clamping the blanket.

13. The method of manufacturing the organic electroluminescence display device according to claim 11, wherein the blanket includes, at least on a surface of the blanket, a layer having a silicone rubber.

14. The method of manufacturing the organic electroluminescence display device according to claim 11, wherein the blanket is supported by a rigid member.

15. The method of manufacturing the organic electroluminescence display device according to claim 9, wherein the protrusion is formed in a part of a peripheral region of the light emission region on the drive substrate.

16. The method of manufacturing the organic electroluminescence display device according to claim 9, further comprising forming a pixel separation film on the drive substrate after the formation of the first electrodes, the pixel separation film having openings that oppose the respective first electrodes, wherein the protrusion is formed in the forming of the pixel separation film together.

17. The method of manufacturing the organic electroluminescence display device according to claim 9, further comprising forming a planarizing film on a surface of the drive substrate before the formation of the first electrodes,
wherein the protrusion is formed in the forming of the planarizing film together.

18. The method of manufacturing the organic electroluminescence display device according to claim 9, wherein a material of the protrusion includes one of a polyimide resin, an acrylic resin, and a novolac resin.

19. An electronic system with an organic electroluminescence display device, the organic electroluminescence display device comprising:
a light emission region including a plurality of pixels on a drive substrate, each of the pixels including, in order from a side close to the drive substrate, a first electrode, a functional layer, and a second electrode, the first electrode being provided for each of the pixels, and the functional layer including an organic electroluminescence layer;
a print pattern layer included in the functional layer and being formed individually for each of the pixels; and
a protrusion provided on the drive substrate and protruding further than any layer provided between the print pattern layer and the drive substrate, wherein the protrusion extends from a point that is a first distance from the drive substrate to a point that is a second distance from the drive substrate, wherein the organic electroluminescence layer is located farther from the drive substrate than the first distance and closer to the drive substrate than the second distance, and wherein the protrusion is not placed between any two pixels of the light emission region.

* * * * *